(12) United States Patent
Ko et al.

(10) Patent No.: US 12,324,134 B2
(45) Date of Patent: Jun. 3, 2025

(54) ELASTIC MEMBER AND DISPLAY DEVICE COMPRISING SAME

(71) Applicant: LG INNOTEK CO., LTD., Seoul (KR)

(72) Inventors: Sang Jun Ko, Seoul (KR); Sung Won Kang, Seoul (KR); Duck Hoon Park, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 231 days.

(21) Appl. No.: 18/013,315

(22) PCT Filed: Jun. 18, 2021

(86) PCT No.: PCT/KR2021/007688
§ 371 (c)(1),
(2) Date: Dec. 28, 2022

(87) PCT Pub. No.: WO2022/005070
PCT Pub. Date: Jan. 6, 2022

(65) Prior Publication Data
US 2023/0301043 A1     Sep. 21, 2023

(30) Foreign Application Priority Data
Jun. 29, 2020   (KR) .................. 10-2020-0079402

(51) Int. Cl.
*H05K 7/20*      (2006.01)
(52) U.S. Cl.
CPC .................. *H05K 7/20963* (2013.01)
(58) Field of Classification Search
None
See application file for complete search history.

(56) References Cited

U.S. PATENT DOCUMENTS

| 8,961,713 | B2 | 2/2015 | Yamada et al. |
| 8,961,717 | B2 | 2/2015 | Yamada et al. |
| 9,769,920 | B2 * | 9/2017 | Ely ............... H05K 1/0281 |

(Continued)

FOREIGN PATENT DOCUMENTS

| CN | 108520703 | 9/2018 |
| CN | 109699151 | 4/2019 |

(Continued)

OTHER PUBLICATIONS

International Search Report dated Oct. 7, 2021 issued in Application No. PCT/KR2021/007688.

(Continued)

*Primary Examiner* — Courtney L Smith
(74) *Attorney, Agent, or Firm* — KED & ASSOCIATES, LLP

(57) ABSTRACT

An elastic member, according to one embodiment, comprises: a first layer comprising a first region and a second region; and a second layer on the first layer, wherein the first region is defined as a folding region, the second region is defined as an unfolding region, the first layer is disposed on a second region of the second layer, a pattern part comprising a plurality of holes or grooves is disposed in at least one region among a first region and the second region of the second layer, and the second layer is thicker than the first layer.

20 Claims, 15 Drawing Sheets

(56) References Cited

U.S. PATENT DOCUMENTS

| | | |
|---|---|---|
| 10,429,895 B2 | 10/2019 | Lee |
| 10,524,358 B2* | 12/2019 | Myung ................ H01L 27/124 |
| 11,324,129 B2 | 5/2022 | Chu |
| 11,327,533 B2 | 5/2022 | Wang et al. |
| 11,513,560 B2* | 11/2022 | Dong ........................ B32B 9/04 |
| 11,877,466 B2* | 1/2024 | Kang ...................... B32B 15/18 |
| 11,977,414 B2* | 5/2024 | Park .................... H04M 1/0268 |
| 12,011,907 B2* | 6/2024 | Park ...................... G06F 1/1652 |
| 2011/0070461 A1 | 3/2011 | Yamada et al. |
| 2014/0173860 A1 | 6/2014 | Yamada et al. |
| 2016/0195902 A1 | 7/2016 | Huh et al. |
| 2017/0034906 A1* | 2/2017 | Myung ................ G06F 1/1652 |
| 2018/0150108 A1 | 5/2018 | Song |
| 2019/0204872 A1 | 7/2019 | Lee |
| 2019/0334114 A1 | 10/2019 | Park |
| 2019/0385491 A1 | 12/2019 | Xu et al. |
| 2020/0245501 A1 | 7/2020 | Wu et al. |
| 2020/0321551 A1* | 10/2020 | Kim ........................ H05K 1/147 |
| 2021/0141419 A1 | 5/2021 | Wang et al. |
| 2021/0337676 A1 | 10/2021 | Chu |
| 2022/0295655 A1 | 9/2022 | Zhu et al. |

FOREIGN PATENT DOCUMENTS

| | | |
|---|---|---|
| CN | 110544431 | 12/2019 |
| CN | 110796955 | 2/2020 |
| CN | 110853520 | 2/2020 |
| JP | 2014-111280 | 6/2014 |
| JP | 2019-219545 | 12/2019 |
| JP | 2020-086462 | 6/2020 |
| KR | 10-1181573 | 9/2012 |
| KR | 10-2013-0105021 | 9/2013 |
| KR | 10-2017-0015599 | 2/2017 |
| KR | 10-2018-0036857 | 4/2018 |
| KR | 10-2018-0062272 | 6/2018 |
| KR | 10-2019-0080740 | 7/2019 |
| KR | 10-2019-0082339 | 7/2019 |
| WO | WO 2009/139495 | 11/2009 |

OTHER PUBLICATIONS

European Search Report dated Jun. 26, 2024 issued in Application No. 21831605.7.

Japanese Office Action dated Dec. 26, 2023 issued in Application No. 2022-580482.

* cited by examiner

[FIG. 1]
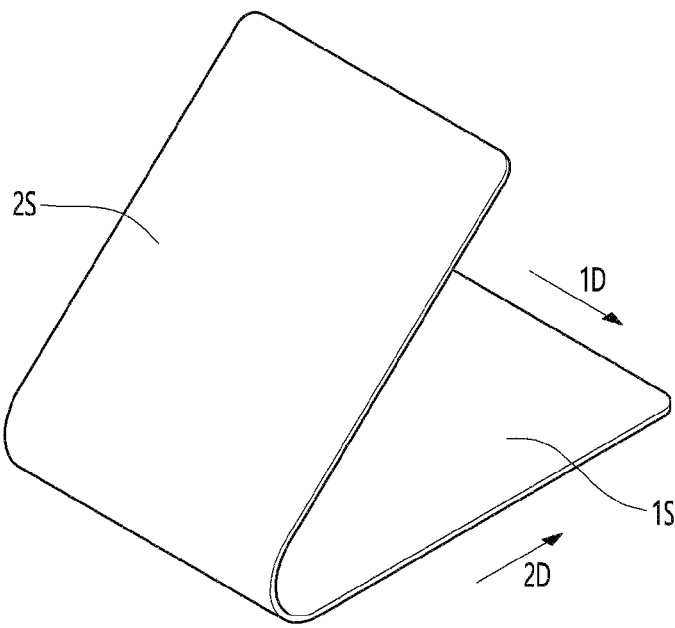
[FIG. 2]
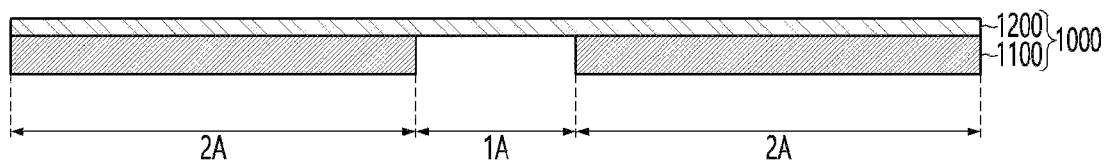
[FIG. 3]
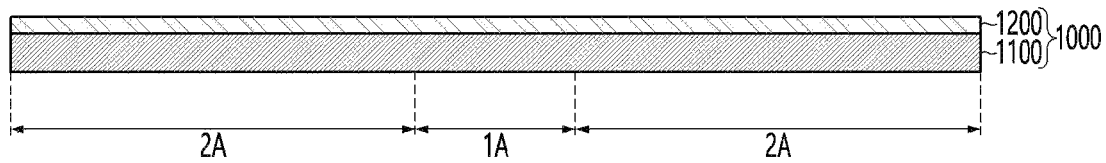

[FIG. 4]
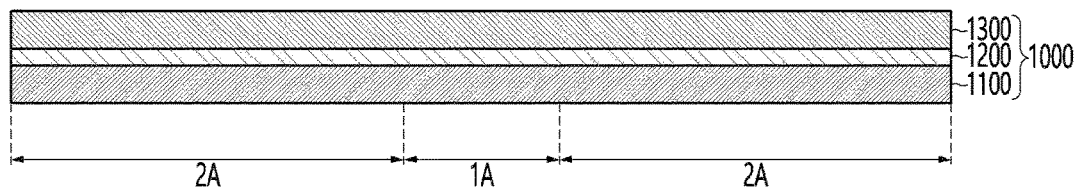
[FIG. 5]
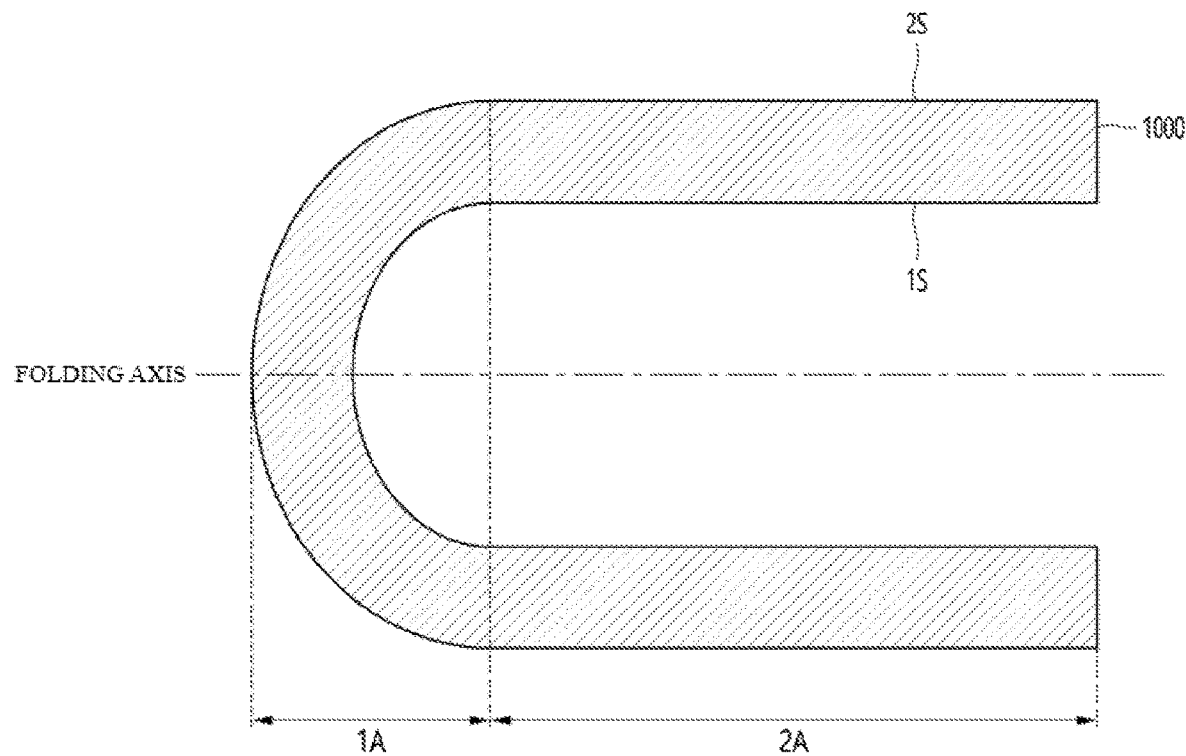

[FIG. 6]
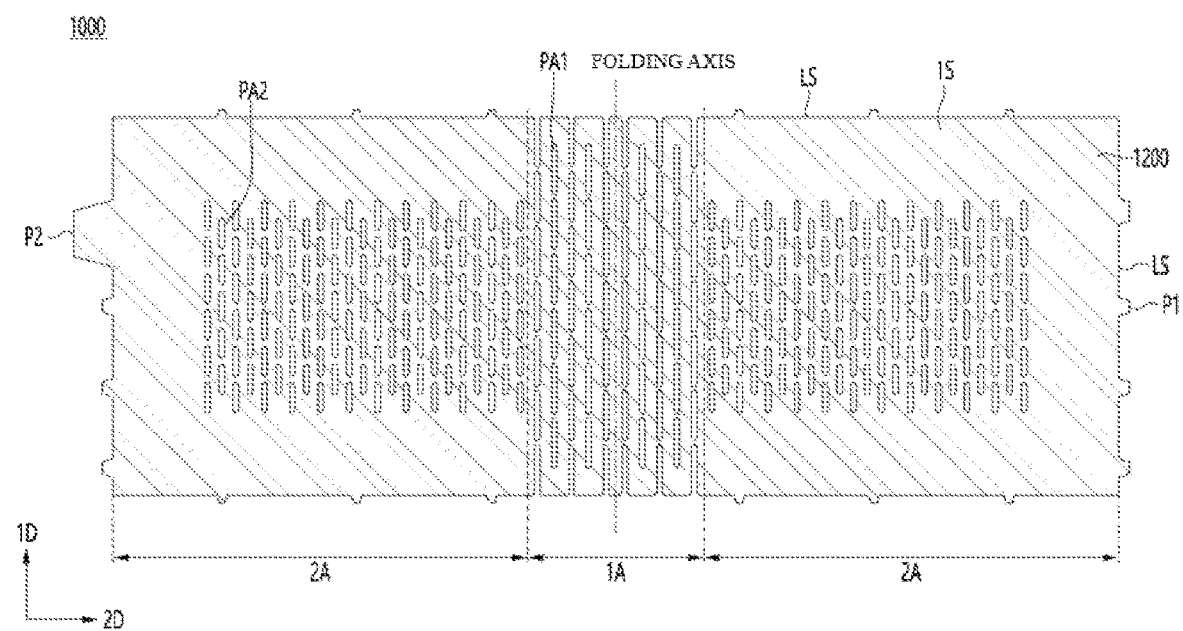

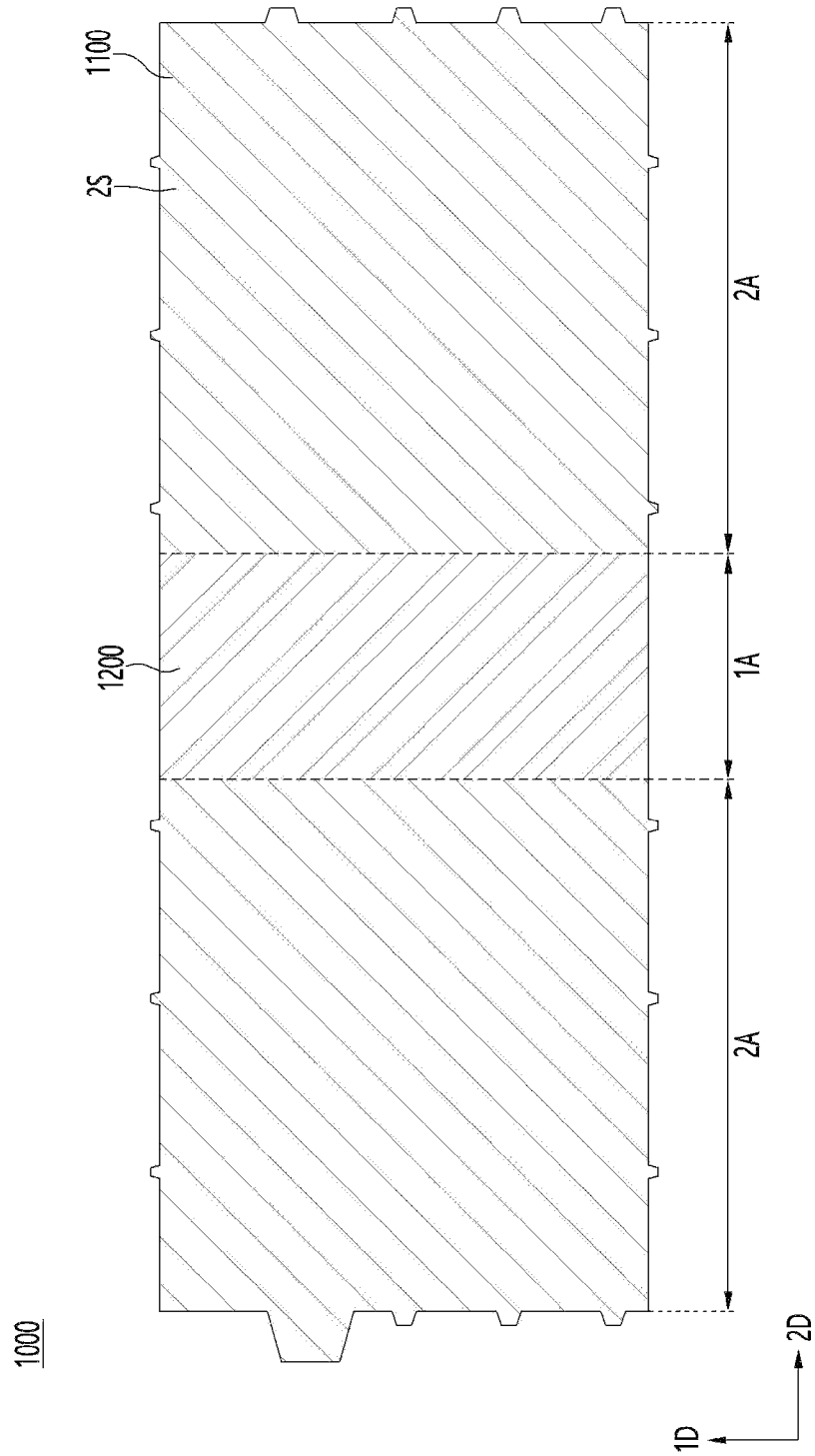
[FIG. 7]

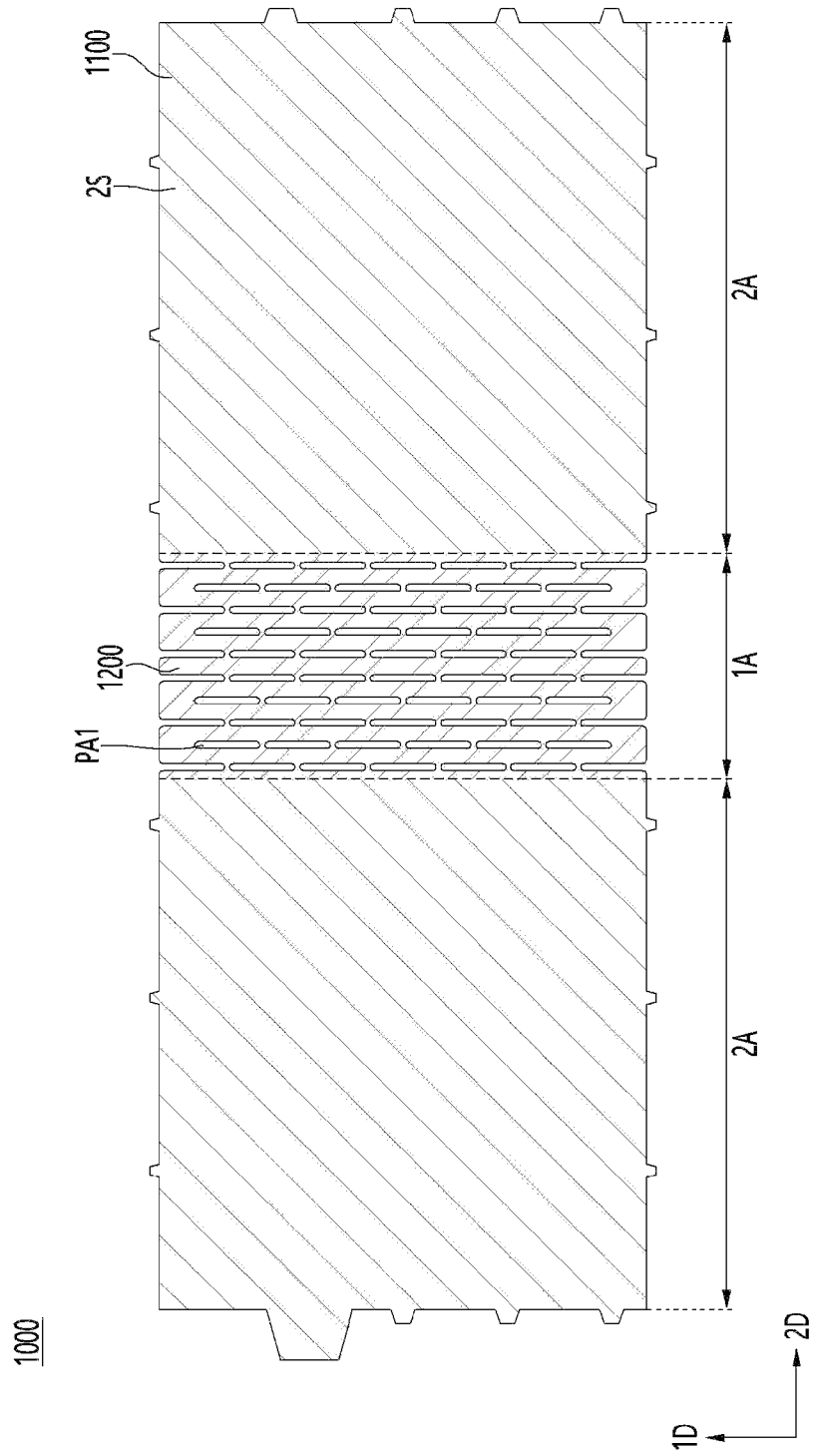

[FIG. 9]
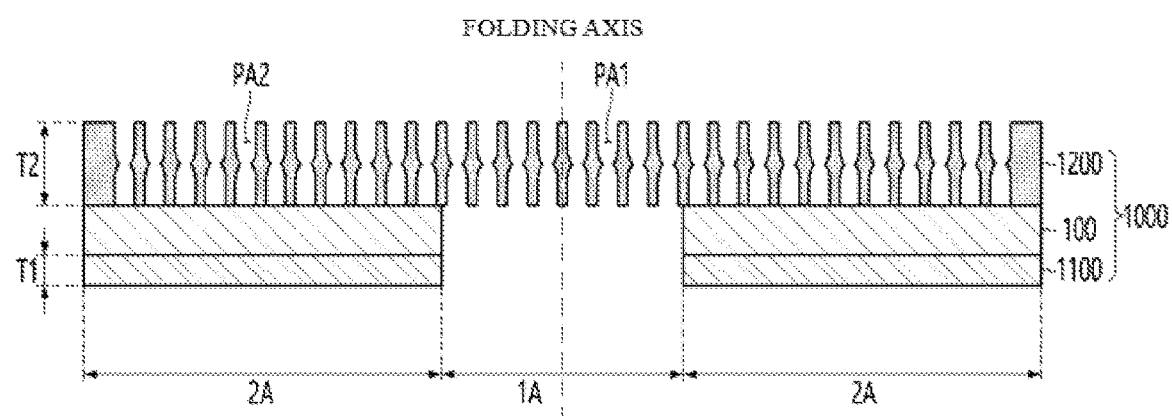
[FIG. 10]
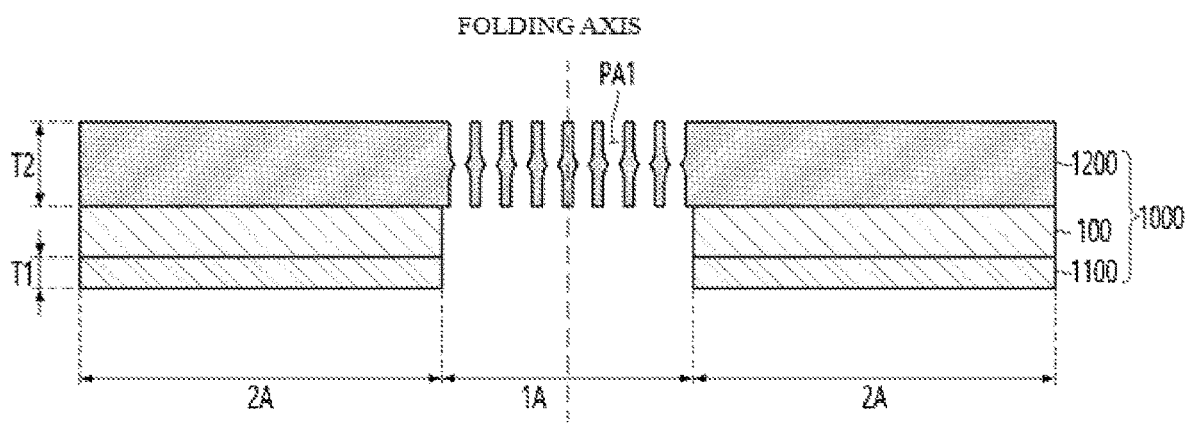

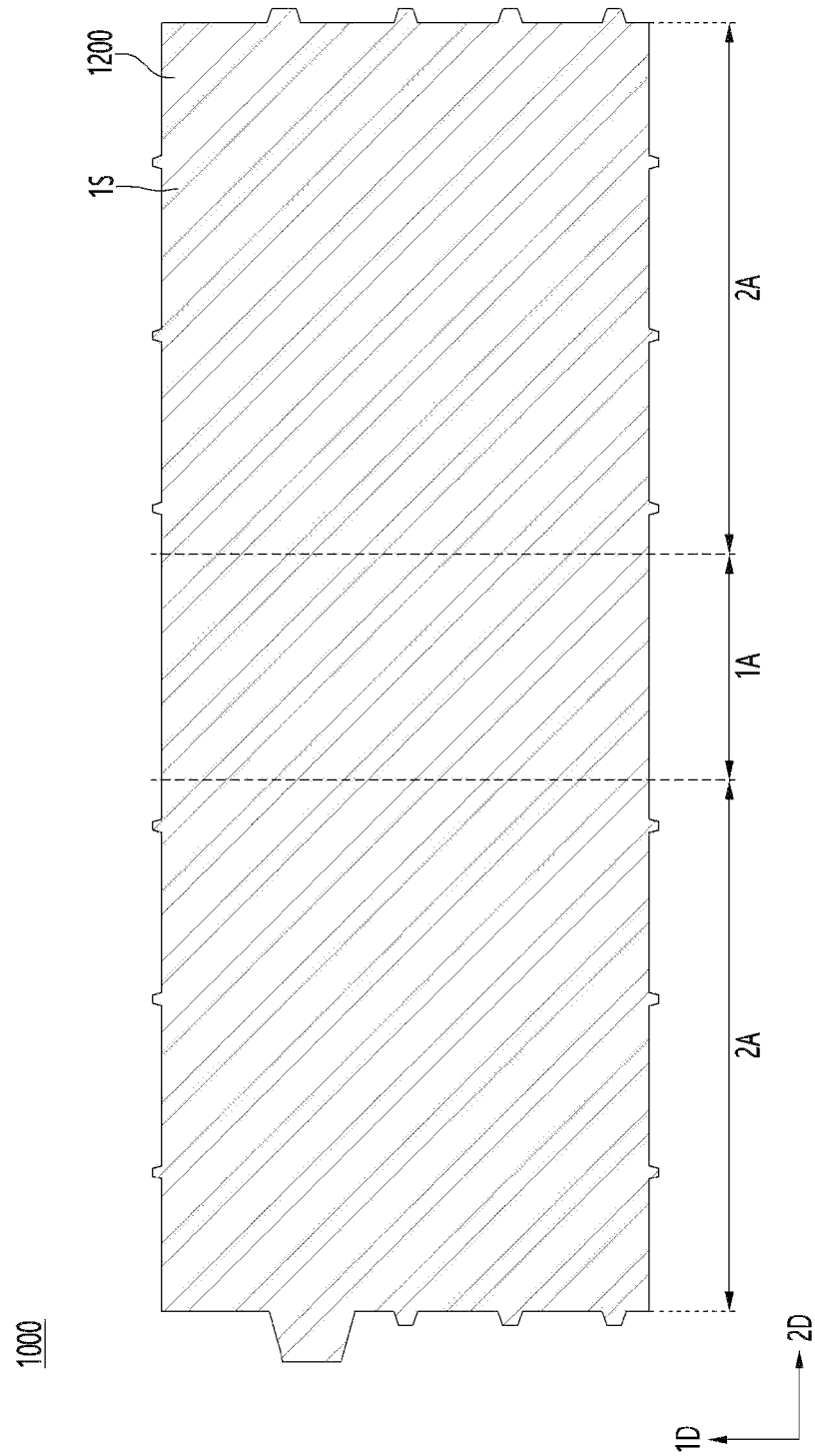
[FIG. 11]

[FIG. 12]
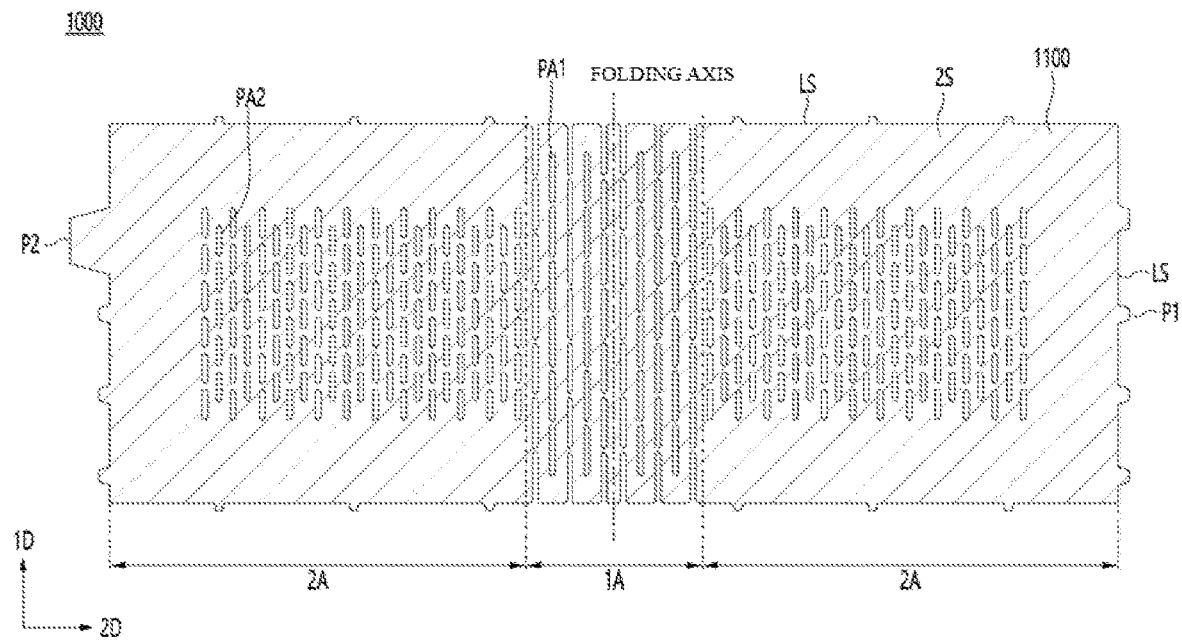
[FIG. 13]
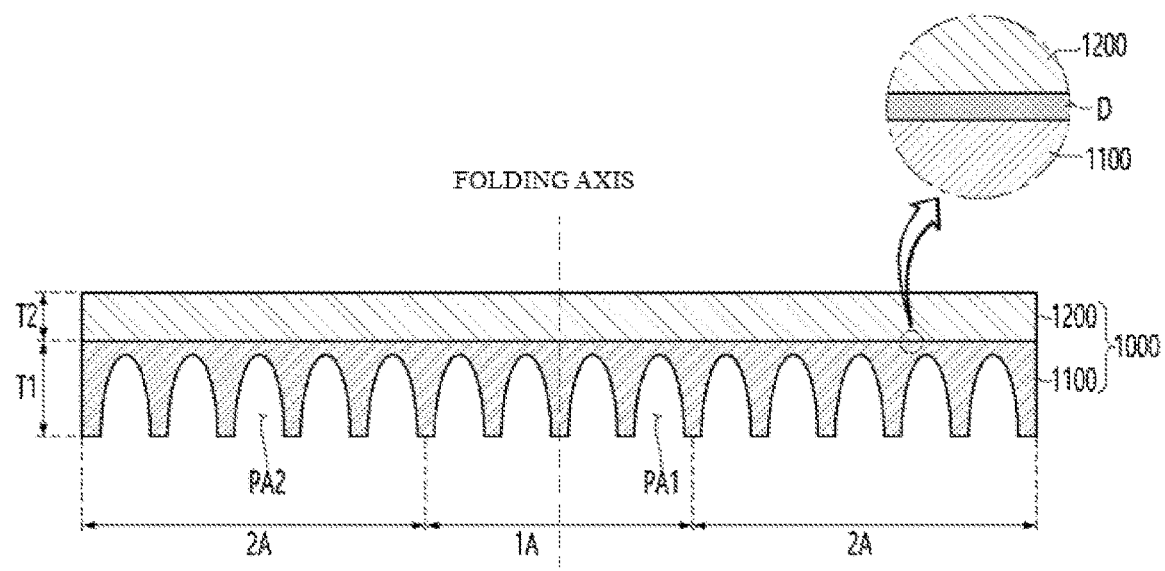

[FIG. 14]
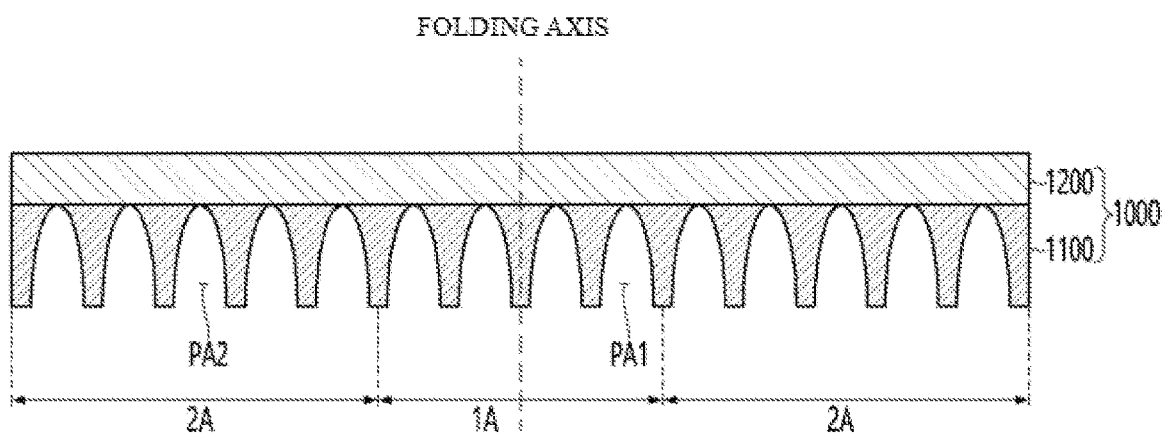
[FIG. 15]
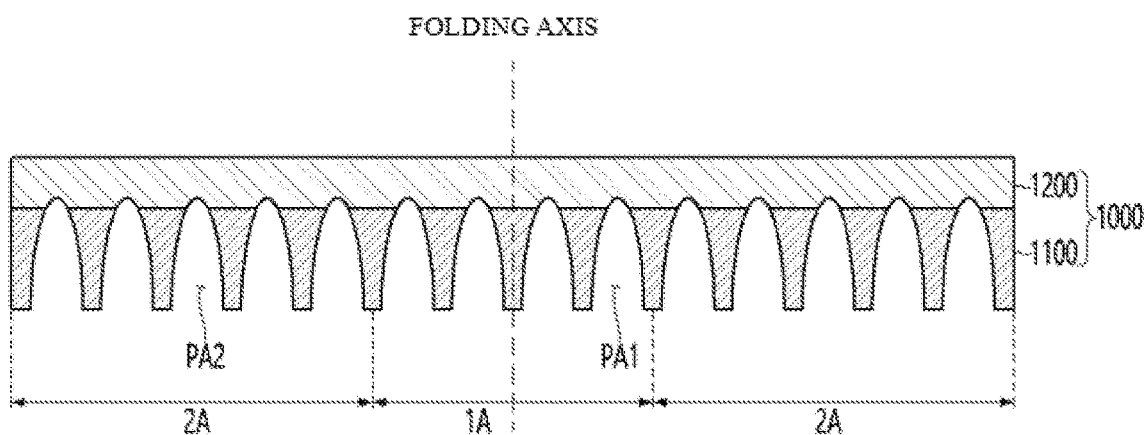

[FIG. 16]
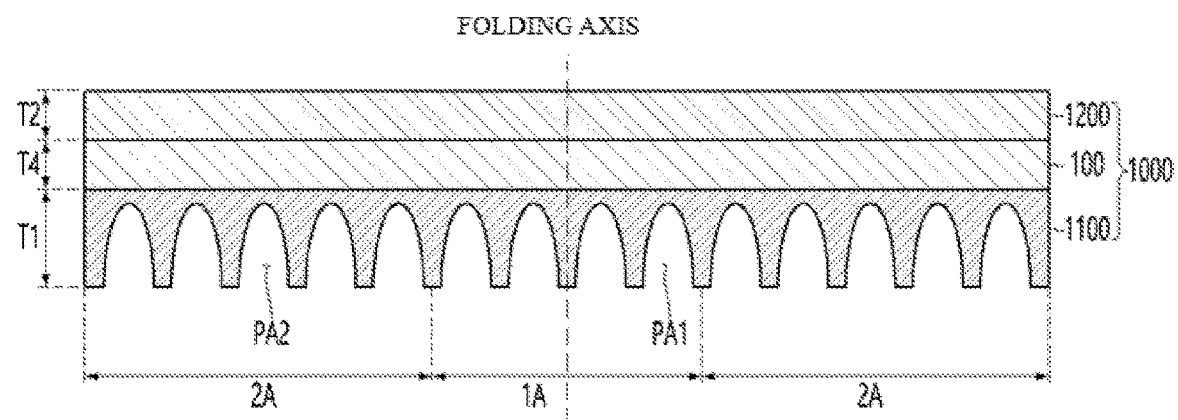
[FIG. 17]
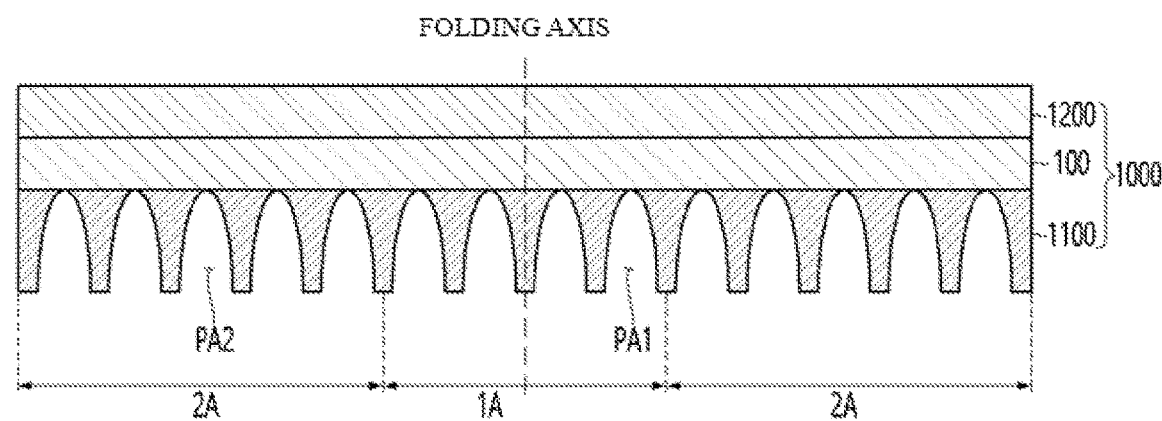

[FIG. 18]
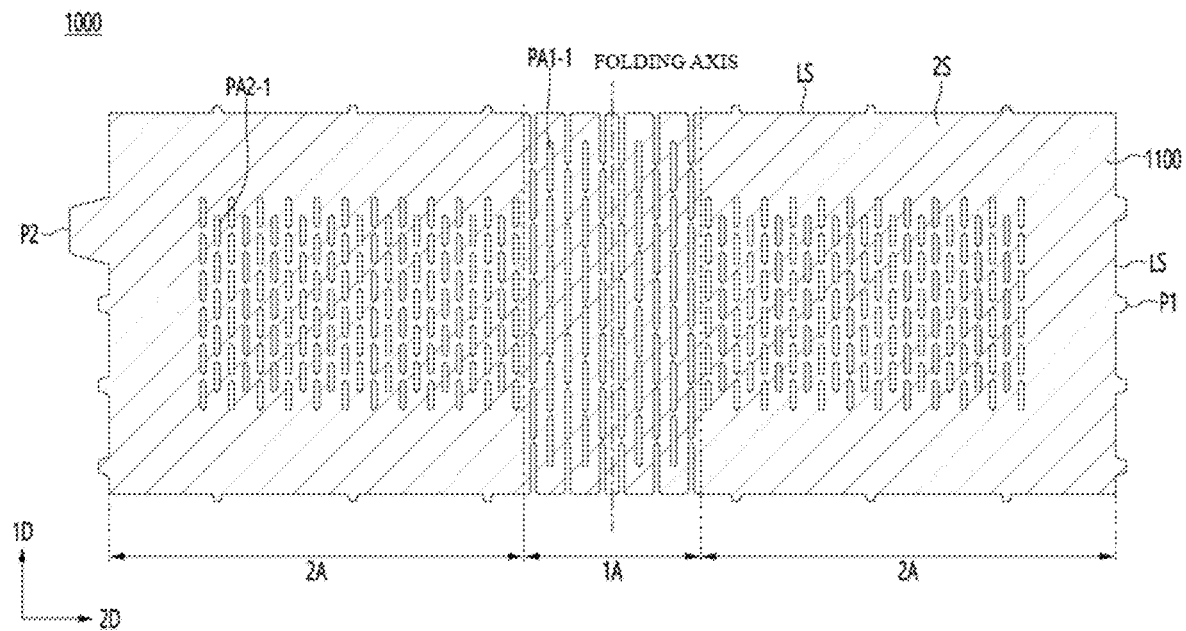
[FIG. 19]
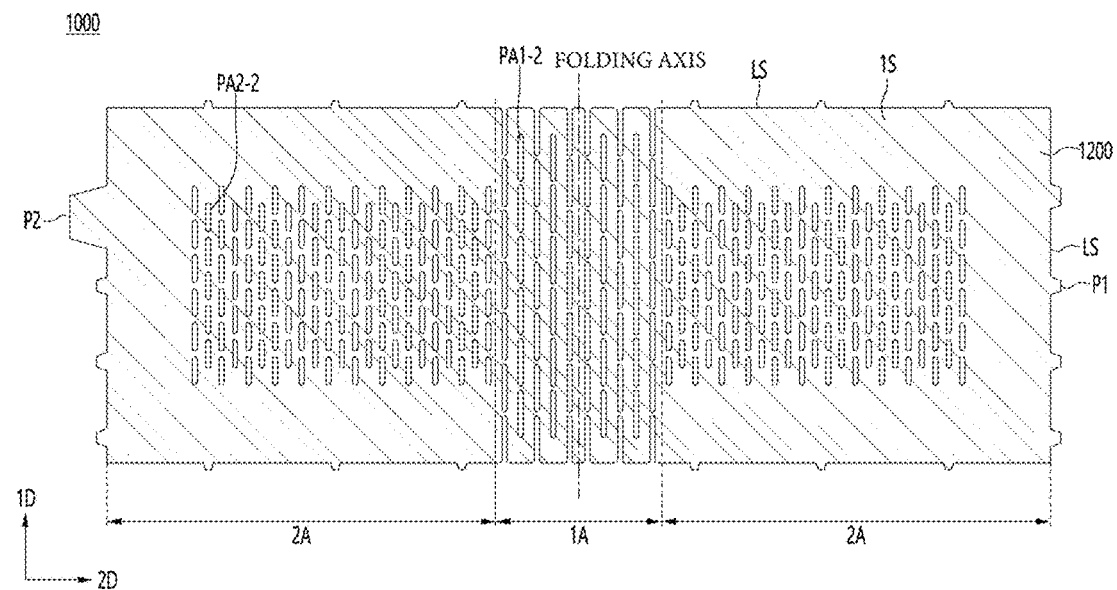

[FIG. 20]
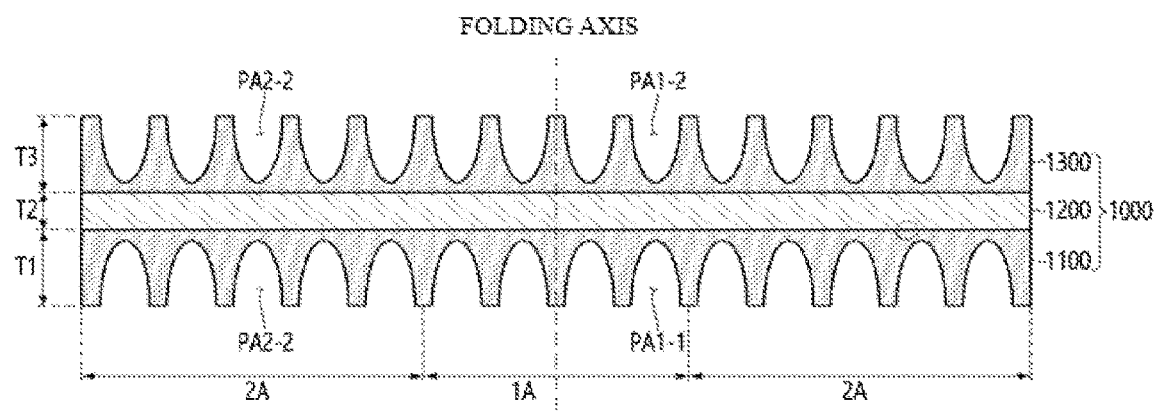
[FIG. 21]
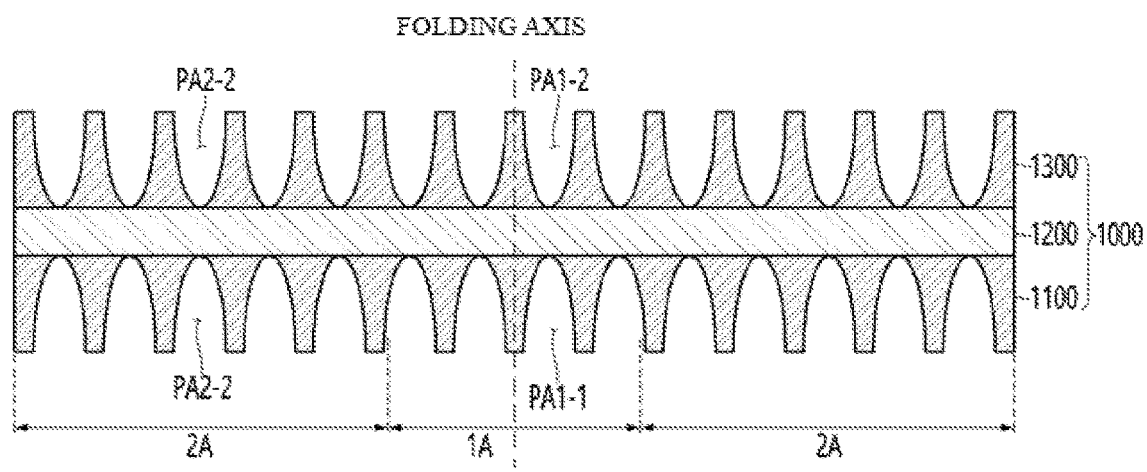

【FIG. 22】
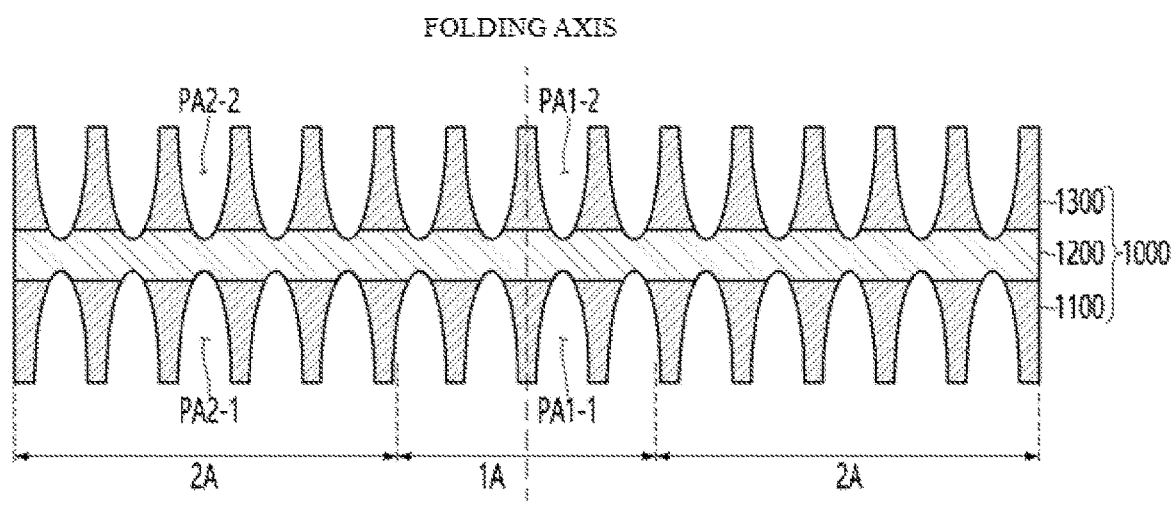
【FIG. 23】
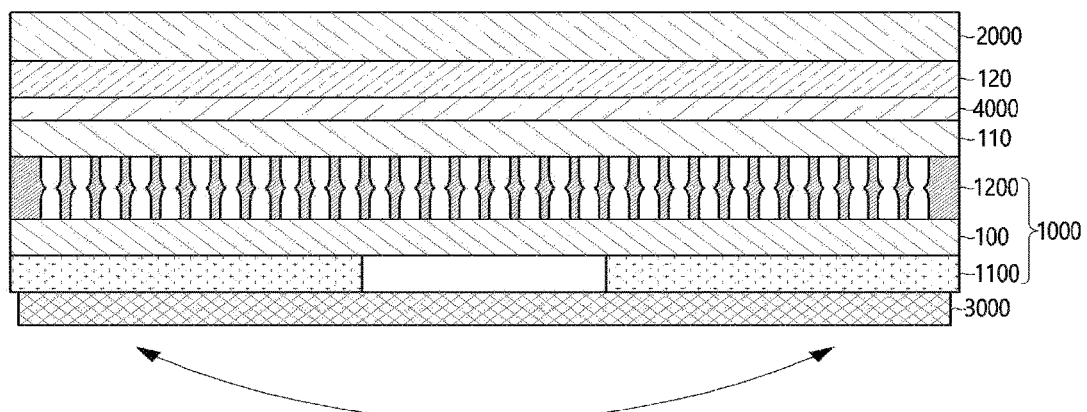

[FIG. 24]
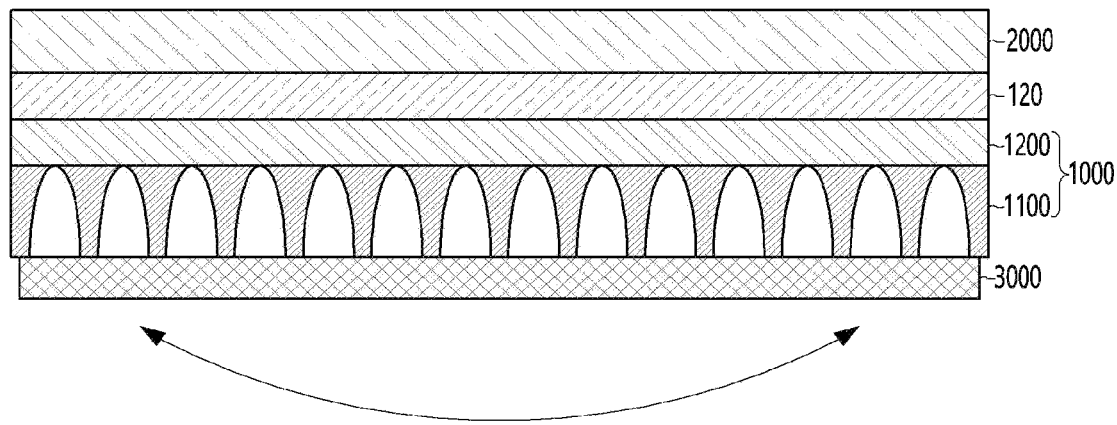
[FIG. 25]
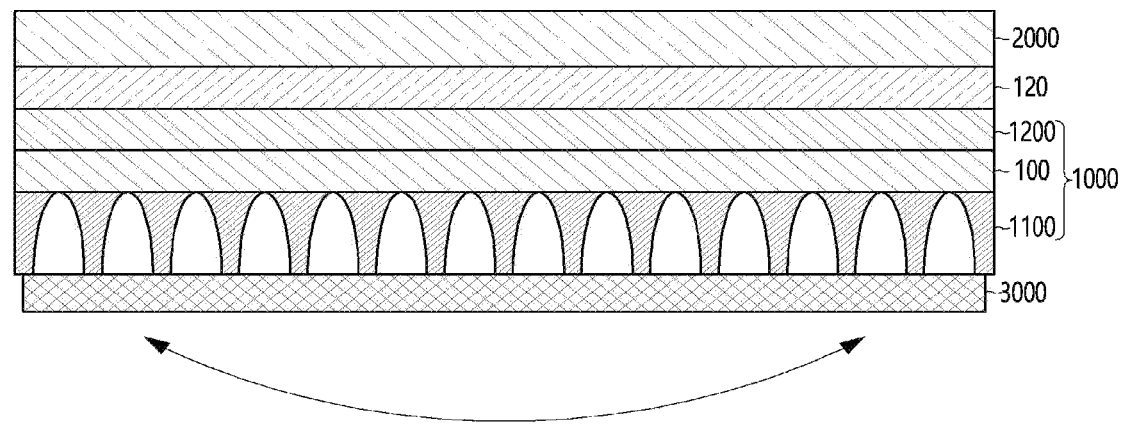
[FIG. 26]
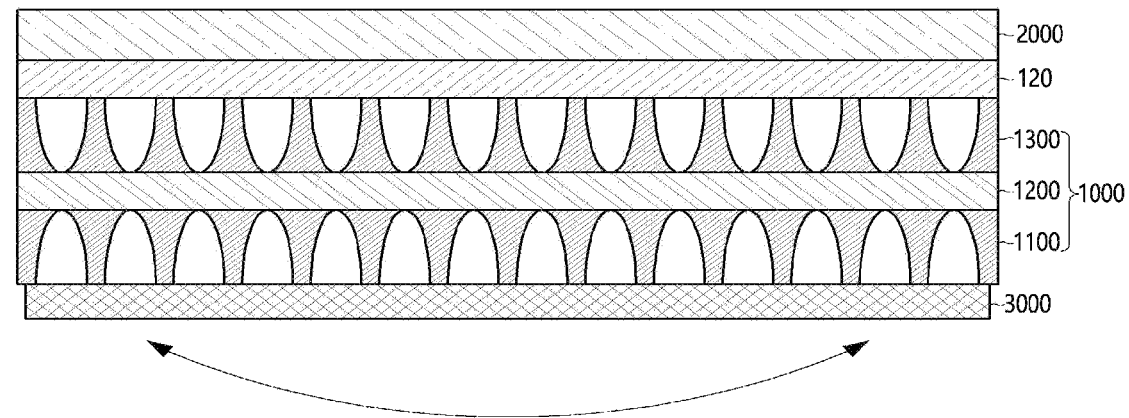

[FIG. 27]
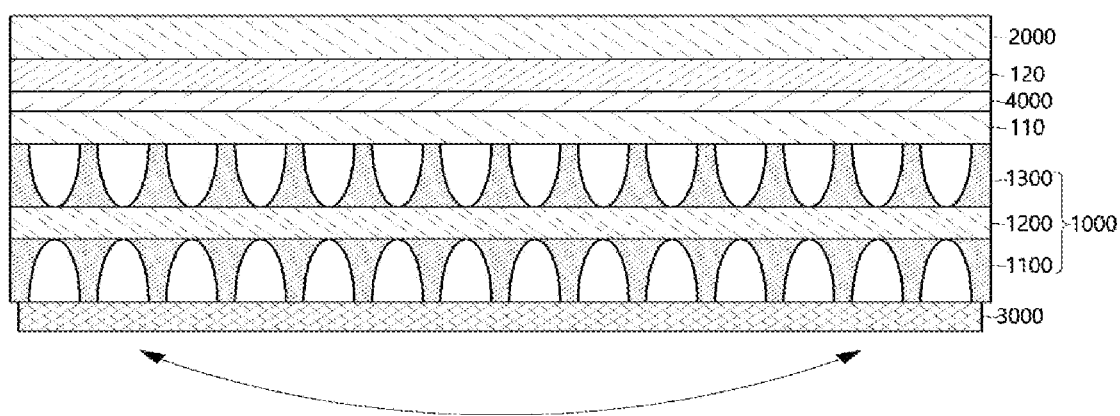
[FIG. 28]
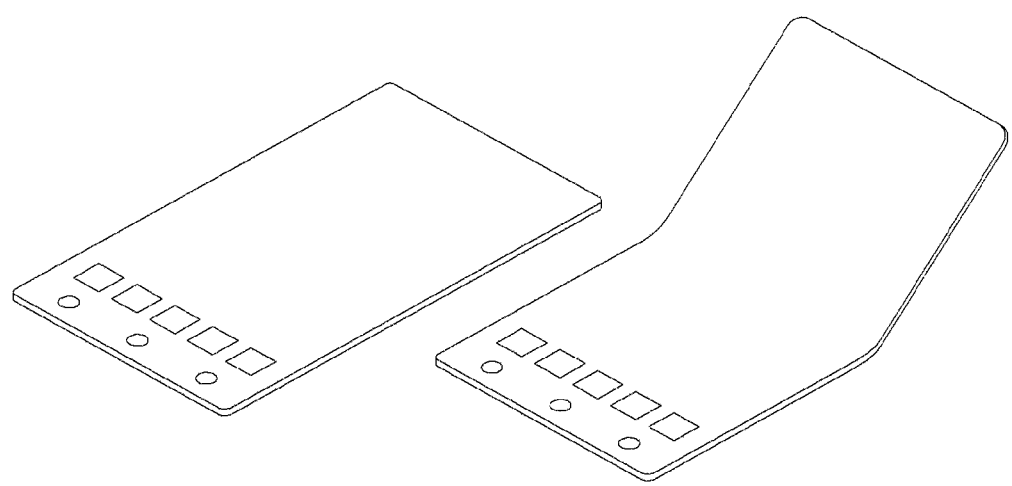

ELASTIC MEMBER AND DISPLAY DEVICE COMPRISING SAME

CROSS-REFERENCE TO RELATED PATENT APPLICATIONS

This application is a U.S. National Stage Application under 35 U.S.C. § 371 of PCT Application No. PCT/KR2021/007688, filed Jun. 18, 2021, which claims priority to Korean Patent Application No. 10-2020-0079402, filed Jun. 29, 2020, whose entire disclosures are hereby incorporated by reference.

TECHNICAL FIELD

The embodiment relates to an elastic member and a display device including the same.

BACKGROUND ART

Recently, there is an increasing demand for a flexible or foldable display device capable of easily carrying various applications and displaying an image on a large screen when being carried.

Such a flexible or foldable display device is folded or partially bent when being carried or stored, and may be implemented with the display unfolded when displaying images. Accordingly, an image display region may be increased, and a user may easily carry the display.

After the flexible or foldable display device is folded or bent, a restoration process of unfolding the flexible display device again may be repeated.

That is, since the flexible or foldable display device repeats folding and unfolding operations, the substrate of the flexible display device requires predetermined strength and elastic force, and cracks or deformation should not occur in the substrate during folding and restoration.

Meanwhile, a display substrate, which is an elastic member constituting a flexible or foldable display device, may be applied to a display device. That is, the display substrate may be applied to a display device displaying a screen by disposing a display panel or a touch panel on an elastic member.

In this case, heat generated from the display panel or the touch panel is transferred to the elastic member, and the heat is not quickly released from within the elastic member, and thus the remaining heat may cause deformation of the elastic member.

Strength and elasticity of the elastic member may be deformed due to the deformation, and folding reliability of the elastic member or the display device including the elastic member may be deteriorated.

Therefore, there is a need for an elastic member having a new structure capable of ensuring heat dissipation characteristics of the elastic member and preventing deformation of the elastic member.

DISCLOSURE

Technical Problem

An embodiment is directed to providing an elastic member capable of reducing a thickness and having an improved heat dissipation effect.

Technical Solution

An elastic member according to an embodiment includes: a first layer including a first region and a second region; and a second layer on the first layer, wherein the first region is defined as a folding region, the second region is defined as an unfolding region, and the first layer is disposed on the second region of the second layer, a pattern part including a plurality of holes or grooves is disposed in at least one of the first and second regions of the second layer, and the second layer has a thickness greater than that of the first layer.

An elastic member according to an embodiment is an elastic member including a first region and a second region, and the elastic member includes: a first layer; and a second layer on the first layer, wherein the first region is defined as a folding region, the second region is defined as an unfolding region, a pattern part including a plurality of holes or grooves is disposed in at least one of the first region and the second region of the first layer, and a thermal conductivity of the first layer is greater than that of the second layer.

Advantageous Effects

An elastic member according to an embodiment may include a plurality of layers. In detail, the elastic member according to the embodiment may be formed by stacking a layer having high thermal conductivity and a layer having high strength.

Accordingly, when the elastic member is applied to a display device, heat transferred from a display panel may be effectively dissipated to the outside.

Accordingly, elasticity and strength of the elastic member may be maintained by preventing the elastic member from being deformed by heat, and thus folding characteristics of the elastic member can be maintained.

In addition, by making a thickness of a heat dissipation layer smaller than a thickness of the elastic member, it is possible to effectively dissipate heat to the outside while improving the folding characteristics of the elastic member.

In addition, the elastic member according to the embodiment may have improved folding reliability and heat dissipation characteristics.

In detail, in the elastic member according to the embodiment, the heat dissipation characteristics of the elastic member may be improved by forming a thickness of the first layer (and/or the third layer) having high thermal conductivity to be greater than that of the second layer. In addition, by forming a pattern part in the first layer (and/or the third layer) to form an opening, it is possible to reduce compressive stress applied when the elastic member is folded, thereby easily folding the elastic member.

In addition, since an additional pattern part is not formed in the second layer having high yield strength, a strength of the second layer can be maintained, and thus it is possible to minimize plastic deformation of the elastic member that occurs during folding or restoring due to the second layer having a high deformation rate when the elastic member is folded.

Therefore, the elastic member according to the embodiment may have improved folding reliability and improved heat dissipation characteristics, and thus an additional heat dissipation layer is not required, thereby reducing the thickness of the elastic member or a thickness of the display device to which the elastic member is applied.

DESCRIPTION OF DRAWINGS

FIG. 1 is a view illustrating a perspective view of an elastic member according to an embodiment.

FIG. 2 is a view illustrating a side view of an elastic member according to a first embodiment before folding.

FIG. 3 is a view illustrating a side view of an elastic member according to second and third embodiments before folding.

FIG. 4 is a view illustrating a side view of an elastic member according to a fourth embodiment before folding.

FIG. 5 is a view illustrating a side view of the elastic member according to the embodiment after folding.

FIG. 6 is a view illustrating a top view of a first surface of the elastic member according to the first embodiment.

FIGS. 7 and 8 are views illustrating a top view of a second surface of the elastic member according to the first embodiment.

FIG. 9 is a view illustrating a cross-sectional view of the elastic member according to the first embodiment.

FIG. 10 is a view illustrating another cross-sectional view of the elastic member according to the first embodiment.

FIG. 11 is a view illustrating a top view of a first surface of the elastic member according to the second embodiment.

FIG. 12 is a view illustrating a top view of a second surface of the elastic member according to the second embodiment.

FIGS. 13 to 15 are views illustrating a cross-sectional view of the elastic member according to the second embodiment.

FIGS. 16 to 17 are views illustrating a cross-sectional view of the elastic member according to the third embodiment.

FIG. 18 is a view illustrating a top view of a first surface of the elastic member according to the fourth embodiment.

FIG. 19 is a view illustrating a top view of a second surface of the elastic member according to the fourth embodiment.

FIGS. 20 to 22 are views illustrating a cross-sectional view of the elastic member according to the second embodiment.

FIGS. 23 to 27 are views illustrating a cross-sectional view of a display device including an elastic member according to an embodiment.

FIG. 28 is a view for describing an application example of an elastic member according to embodiments.

MODES OF THE INVENTION

Hereinafter, preferred embodiments of the present invention will be described in detail with reference to the accompanying drawings. However, the spirit and scope of the present invention is not limited to a part of the embodiments described, and may be implemented in various other forms, and within the spirit and scope of the present invention, one or more of the elements of the embodiments may be selectively combined and replaced. In addition, unless expressly otherwise defined and described, the terms used in the embodiments of the present invention (including technical and scientific terms) may be construed the same meaning as commonly understood by one of ordinary skill in the art to which the present invention belongs, and the terms such as those defined in commonly used dictionaries may be interpreted as having a meaning that is consistent with their meaning in the context of the relevant art.

In addition, the terms used in the embodiments of the present invention are for describing the embodiments and are not intended to limit the present invention. In this specification, the singular forms may also include the plural forms unless specifically stated in the phrase, and may include at least one of all combinations that may be combined in A, B, and C when described in "at least one (or more) of A (and), B, and C".

Further, in describing the elements of the embodiments of the present invention, the terms such as first, second, A, B, (a), and (b) may be used. These terms are only used to distinguish the elements from other elements, and the terms are not limited to the essence, order, or order of the elements.

In addition, when an element is described as being "connected" or "coupled" to another element, it may include not only when the element is directly "connected" or "coupled" to other elements, but also when the element is "connected" or "coupled" by another element between the element and other elements.

Further, when described as being formed or disposed "on (over)" or "under (below)" of each element, the "on (over)" or "under (below)" may include not only when two elements are directly connected to each other, but also when one or more other elements are formed or disposed between two elements.

Furthermore, when expressed as "on (over)" or "under (below)", it may include not only the upper direction but also the lower direction based on one element.

Hereinafter, an elastic member according to an embodiment will be described with reference to the drawings.

FIGS. 1 to 5 are views illustrating a perspective view of an elastic member according to an embodiment and a side view before and after folding.

Referring to FIGS. 2 to 4, an elastic member 1000 may be formed in a single layer or in multiple layers.

In detail, the elastic member 1000 may be formed in multiple layers. For example, the elastic member 1000 may include a plurality of layers including metal, metal alloy, plastics, a composite material (e.g., a carbon fiber reinforced plastic, a magnetic or conductive material, a glass fiber reinforced material, etc.), ceramic, sapphire, glass, and the like.

Referring to FIGS. 2 and 3, the elastic member 1000 may include a first layer 1100 and a second layer 1200. In detail, the elastic member 1000 may include the first layer 1100 and the second layer 1200 disposed on the first layer 1100.

Referring to FIGS. 2 and 3, the first layer 1100 and the second layer 1200 may have the same or different thicknesses. For example, referring to FIGS. 2 and 3, a thickness of the first layer 1100 may be greater than that of the second layer 1200. However, the embodiment is not limited thereto, and the thickness of the second layer 1200 may be greater than that of the first layer 1100.

In addition, sizes of the first layer 1100 and the second layer 1200 may be different. For example, referring to FIG. 2, the first layer 1100 may be disposed in a region corresponding to a second region 2A of the second layer 1200. Alternatively, referring to FIG. 3, the first layer 1100 may be disposed in both regions corresponding to a first region 1A and the second region 2A of the second layer 1200.

In addition, referring to FIG. 4, the elastic member 1000 may include a first layer 1100, a second layer 1200, and a third layer 1300. In detail, the elastic member 1000 may include the first layer 1100, the second layer 1200 disposed on the first layer 1100, and the third layer 1300 disposed on the second layer 1200.

At least one of the first layer 1100, the second layer 1200, and the third layer 1300 may include a metal. For example, the first layer 1100, the second layer 1200, and the third layer 1300 may include different types of metals. In addition, at least one of the first layer 1100, the second layer 1200, and the third layer 1300 may include metals having different thermal conductivity. In addition, at least one of the first layer 1100, the second layer 1200, and the third layer 1300 may include metals having different yield strengths.

Shapes, materials, and properties of the first layer 1100, the second layer 1200, and the third layer 1300 will be described in detail below.

The elastic member 1000 may be flexible or foldable. That is, the elastic member 1000 may be folded or bent in one direction. That is, the elastic member 1000 may be a display substrate applied to a flexible display device or a foldable display device.

In the elastic member 1000, a first direction 1D and a second direction 2D that is different from the first direction 1D may be defined. For example, the first direction 1D may be defined as the same direction as a folding axis direction of the elastic member 1000. In addition, the second direction may be a direction perpendicular to the first direction.

In addition, any one direction of the first direction 1D and the second direction 2D may be defined as a width direction of the elastic member 1000, and the other direction may be defined as a longitudinal direction of the elastic member 1000.

The elastic member 1000 may be folded in any one of the width direction and the longitudinal direction of the elastic member 1000 as a folding axis.

Hereinafter, for convenience of description, the first direction is defined as the same direction as the folding axis. In addition, the first direction is defined as the width direction of the elastic member 1000, and the second direction is defined as the longitudinal direction of the elastic member 1000.

The elastic member 1000 may include at least two regions. In detail, the elastic member 1000 may include a first region 1A and a second region 2A.

The first region 1A may be defined as a region where the elastic member 1000 is folded. That is, the first region 1A may be a folding region.

In addition, the second region 2A may be defined as a region where the elastic member 1000 is not folded. That is, the second region 2A may be an unfolding region.

Referring to FIG. 1, the elastic member 1000 may be bent in one direction.

In detail, the elastic member 1000 may include a first surface 1S and a second surface 2S opposite to the first surface 1S. In the elastic member 1000, the first surface 1S or the second surfaces 2S may be bent to face each other.

Hereinafter, for convenience of description, the first surface 1S of the elastic member 1000 is defined as a surface facing the display panel and the like when the elastic member 1000 is applied to a display device, and the second surface 2S is defined as a surface opposite to the first surface 1S.

A bending direction of the elastic member 1000 may vary depending on stress remaining on the first surface 1S and the second surface 2S. In detail, in the elastic member 1000, among the first surface 1S and the second surface 2S, surfaces having a small residual stress may be bent in a direction facing each other.

As described above, the elastic member 1000 may have the first region 1A and the second region 2A defined therein. The first region 1A and the second region 2A may be regions defined when the elastic member 1000 is bent in a direction in which the first surface 1S or the second surface 2S faces each other.

In detail, the elastic member 1000 may be bent in one direction, and the elastic member 1000 may be divided into the first region 1A that is folded (folding region) and the second region 2A that is not folded (unfolding region).

Referring to FIGS. 2 to 5, the elastic member 1000 may include a first region 1A that is a region where the elastic member 1000 is bent. In addition, the elastic member 1000 may include a second region 2A that is not bent and is disposed adjacent to the first region 1A.

For example, the second region 2A may be formed on the left and right sides of the first region 1A, respectively, based on a bending direction of the elastic member 1000. That is, the second region 2A may be disposed at both ends of the first region 1A. That is, the first region 1A may be disposed between the second regions 2A.

The first region 1A and the second region 2A may be formed on the same elastic member 1000. That is, the first region 1A and the second region 2A may be formed integrally with each other without being separated from the same one elastic member 1000.

Sizes of the first region 1A and the second region 2A may be different from each other. In detail, the size of the second region 2A may be greater than the size of the first region 1A.

FIG. 5 is a side view of the elastic member after the elastic member is folded.

Referring to FIG. 5, the elastic member 1000 may be folded in one direction around the folding axis. In detail, the first surfaces 1S may be folded in a direction facing each other along the folding axis.

As the elastic member 1000 is folded in one direction, the first region 1A and the second region 2A may be formed on the elastic member 1000. That is, a folding region formed as the elastic member 1000 is folded in one direction and an unfolding region positioned at both ends of the folding region may be formed on the elastic member 1000.

The folding region may be defined as a region where a curvature R is formed, and the unfolding region may be defined as a region where the curvature R is not formed or the curvature is close to zero.

Referring to FIGS. 2 to 5, the elastic member 1000 may be folded in one direction to be formed in an order of the unfolding region, the folding region, and the unfolding region.

A plurality of pattern parts may be formed in at least one of the first region 1A and the second region 2A in order to reduce and distribute stress generated when the elastic member 1000 is folded. The pattern parts will be described in detail below.

Meanwhile, FIG. 4 illustrates that the first surfaces 1S of the elastic member 1000 are folded to face each other, but the embodiment is not limited thereto, and the second surfaces 2S may be folded to face each other. That is, as described above, the bending direction of the elastic member 1000 may vary depending on a magnitude of the stress remaining on the first surface 1S and the second surface 2S.

In detail, a folded surface of the elastic member may vary depending on a formation position of the pattern part formed on the elastic member 1000 to be described below.

That is, in the elastic member 1000, surfaces on which the pattern parts of the elastic member 1000 are formed may be folded to face each other.

Hereinafter, an elastic member according to various embodiments will be described in detail with reference to the drawings.

Hereinafter, an elastic member according to a first embodiment will be described with reference to FIGS. 6 to 10.

Referring to FIGS. 6 to 8 are views illustrating a top view of the elastic member according to the first embodiment. FIG. 6 is a view illustrating a top view of a first surface of the elastic member according to the embodiment, and FIGS. 7 and 8 are views illustrating a top view of a second surface of the elastic member according to the embodiment.

Referring to FIG. 6, a plurality of pattern parts PA may be disposed on the first surface 1S of the elastic member 1000. The first surface 1S of the elastic member 1000 according to the first embodiment may be one surface of the second layer 1200 among the layers of the elastic member. That is, the elastic member 1000 according to the first embodiment may include a plurality of pattern parts formed on the second layer 1200.

In detail, a first pattern part PA1 may be disposed in the first region 1A of the elastic member 1000. In addition, a second pattern part PA2 may be disposed in the second region 2A of the elastic member 1000. However, the embodiment is not limited thereto, and the elastic member 1000 may include only the first pattern part PA1 disposed in the first region 1A, and a pattern part may not be disposed in the second region 2A.

At least one of the first pattern part PA1 and the second pattern part PA2 may be disposed to extend in the same or similar direction to the folding axis.

The elastic member 1000 may be easily folded by the first pattern part PA1 disposed in the first region 1A.

That is, the elastic member 1000 may reduce a thickness of the first region folded in the elastic member 1000 by the first pattern part PA1. Accordingly, in the elastic member 1000, a stress generation region generated when the elastic member is folded may be reduced. That is, by reducing a thickness of the elastic member proportional to compressive stress in the first region 1A which is the folding region of the elastic member, it is possible to reduce the compressive stress generated when the elastic member is folded.

That is, since the thickness of the elastic member 1000 is reduced in the region where the elastic member 1000 is folded by the first pattern part PA1, and thereby the compressive stress is reduced, it is possible to prevent the elastic member 1000 from being deformed.

The second pattern part PA2 disposed in the second region 2A may improve reliability of the elastic member 1000.

In detail, a difference in deformation due to heat in the first region 1A in which the first pattern part PA1 is disposed may be relieved by the second pattern part PA2 disposed in the second region 2A. That is, when heat is applied to the elastic member 1000, the difference in deformation due to heat in the first region 1A and the second region 2A may be relieved by forming pattern parts in both the first region 1A and the second region 2A. Accordingly, it is possible to prevent the elastic member 1000 from being bent or twisted.

In addition, it is possible to prevent bending of the elastic member by relieving unevenness of the stress between the first region 1A and the second region 2A by the second pattern part PA2 formed in the second region 2A.

In addition, when a panel or the like is adhered on the elastic member 1000 through an adhesive layer by the second pattern part PA2 formed in the second region 2A, since an adhesive material is disposed to fill the inside of the first pattern part PA1 of the second region 2A and the second pattern part PA2 of the second region 2A, it is possible to prevent the adhesive layer forming a step difference between the first and second regions.

In addition, the elastic member 1000 may maintain a predetermined strength even when the second pattern part PA2 is formed in the second region 2A. In detail, an area of the elastic member in which the pattern part is not formed may be secured as a certain area by remaining a region where the pattern part, such as a hole or groove, is not formed in the second region 2A. Accordingly, a strength of the elastic member 1000 may be secured, and support force of the elastic member 1000 supporting a panel or the like may be secured.

Referring to FIGS. 7 and 8, pattern parts may or may not be disposed on the second surface 2S of the elastic member 1000. The second surface 2S of the elastic member 1000 according to the first embodiment may include both the first layer 1100 and the second layer 1200 of the elastic member 1000.

In detail, the first layer 1100 may be disposed only in the second region 2A of the elastic member 1000. Accordingly, the second surface 2S of the elastic member 1000 may be one surface of the second layer 1200 in the first region 1A and may be one surface of the first layer 1100 in the second region 2A.

Referring to FIGS. 7 and 8, the first pattern part PA1 may be formed on the first surface 1S of the elastic member 1000 but may not be formed on the second surface 2S of the elastic member 1000.

In detail, referring to FIG. 7, the first pattern part PA1 may be formed in a groove shape formed by partially etching the second layer 1200, and thus pattern parts may not be disposed on the second surface 2S of the elastic member 1000.

Alternatively, referring to FIG. 8, the first pattern part PA1 may be formed in a hole shape formed through the second layer 1200, and thus a plurality of pattern parts may be disposed the second surface 2S of the elastic member 1000.

At least one of the first pattern part PA1 and the second pattern part PA2 may have a curved surface. For example, at least one of the first pattern part PA1 and the second pattern part PA2 may be formed in a shape having a curved surface, such as an elliptical shape, a hemispherical shape, or a circular shape.

Meanwhile, the elastic member 1000 may include a first protrusion P1. In detail, the first protrusion P1 may be disposed at an edge of the elastic member 1000. In detail, the first protrusion P1 may be disposed at an end of the elastic member 1000.

The first protrusion P1 may be formed during a process of manufacturing the elastic member 1000. In detail, the first protrusion P1 may be formed during a process of manufacturing each of the elastic members 1000 when manufacturing the plurality of elastic members 1000. For example, when a plurality of elastic members are formed to be spaced apart from each other on a large-area metal substrate, and one elastic member is manufactured by cutting each elastic member, the first protrusion P1 may be formed on a cut surface of the elastic member.

The first protrusion P1 may be disposed in the second region 2A. That is, the first protrusion P1 may be disposed in the unfolding region of the elastic member. That is, the first protrusion P1 may be disposed on side surfaces LS of the elastic member 1000 surrounding the second region 2A of the elastic member 1000.

At least one of the first protrusion P1 may be disposed on the side surface LS of the elastic member 1000. For example, the first protrusion P1 may include a plurality of first protrusions P1 that is disposed on the side surface LS of the elastic member 1000 and spaced apart from each other.

In addition, the elastic member 1000 may further include a second protrusion P2.

The second protrusion P2 may be disposed on the side surface LS of the elastic member 1000. For example, the second protrusion P2 may be disposed on at least one of both side surfaces of the elastic member 1000 in the first direction 1D and both sides of the elastic member 1000 in the second direction 2D.

The second protrusion P2 may be integrally formed with the elastic member 1000.

In addition, a width of the second protrusion P2 may be changed from the inside to the outside of the elastic member 1000. In detail, the width of the second protrusion P2 may decrease as it moves away from the side surface LS of the elastic member 1000.

A size of the second protrusion P2 may be greater than that of the first protrusion P1.

The first protrusion P1 described above may not be formed on the second protrusion P2. In detail, the second protrusion P2 and the first protrusion P1 may be disposed to be spaced apart from each other. That is, on the side surface of the elastic member 1000 on which the second protrusion P2 is formed, the first protrusion P1 may be disposed only in a region excluding a region where the second protrusion P2 is disposed.

Accordingly, it is possible to prevent the second protrusion P2 from being deformed or damaged due to a decrease in strength by the first protrusion P1.

When a panel or circuit board is disposed on the elastic member 1000, the second protrusion P2 may serve to dispose at a position corresponding to a coupling portion of the panel or circuit board, or to align the same.

Accordingly, a panel or the like may be easily disposed on the elastic member 1000 and distortion of an alignment may be minimized by the second protrusion P2, and distortion of an alignment may be minimized.

FIGS. 9 and 10 are views illustrating a cross-sectional view of the elastic member according to the first embodiment.

Referring to FIGS. 9 and 10, the elastic member according to the first embodiment may include a first layer 1100 and a second layer 1200 on the first layer 1100.

An area of the first layer 1100 may be smaller than that of the second layer 1200. In detail, the first layer 1100 may be disposed only in a region corresponding to the second region 2A of the elastic member 1000. However, the embodiment is not limited thereto, and the first layer 1100 may also be disposed on a part of the first region 1A.

The first layer 1100 is not disposed in the folding region or is disposed in a part of the folding region, and thus when the elastic member is folded, it is possible to prevent an increase in stress due to an increase in thickness in the first region 1A, so that the folding characteristics of the elastic member may be improved.

An adhesive layer 100 may be disposed between the first layer 1100 and the second layer 1200, and the first layer 1100 and the second layer 1200 may be adhered to each other through the adhesive layer 100.

Although the drawing illustrates that the adhesive layer 100 is disposed only at a position where the first layer 1100 and the second layer 1200 overlap, that is, in the second region 2A, the embodiment is not limited thereto, and the adhesive layer 100 may be disposed in both the first region 1A and the second region 2A.

The adhesive layer 100 may include a pressure sensitive adhesive (PSA). In addition, metal particles may be dispersed and disposed inside the adhesive layer 100. Accordingly, a thermal conductivity of the adhesive layer 100 may be increased by the metal particles, thereby improving heat dissipation characteristics of the elastic member.

The first layer 1100 and the second layer 1200 may be formed to have different thicknesses. For example, the thickness of the second layer 1200 may be greater than that of the first layer 1100.

A thickness T2 of the second layer 1200 may be 90 μm or more. In detail, the thickness T2 of the second layer 1200 may be 90 μm to 200 μm. In more detail, the thickness T2 of the second layer 1200 may be 120 μm to 170 μm.

When the thickness T2 of the second layer 1200 is less than 90 μm, the support strength of the elastic member 1000 is decreased, so that it may be difficult for the elastic member 1000 to support other panels, etc., and when the member 1000 is folded, an elastic force of the elastic member may be reduced.

In addition, when the thickness T2 of the second layer 1200 exceeds 200 μm, the folding characteristics may be deteriorated, such as plastic deformation occurs when the elastic member is folded due to stress of the elastic member 1000. In addition, an overall thickness of the display device to which the elastic member is applied may be increased.

Referring to FIGS. 9 and 10, the above-described pattern part may be disposed on the elastic member 1000. In detail, a plurality of pattern parts may be disposed on the second layer 1200 of the elastic member 1000.

In detail, the second layer 1200 of the elastic member 1000 may include a plurality of pattern parts disposed on at least one of the first region 1A and the second region 2A.

For example, referring to FIG. 9, the first pattern part PA1 and the second pattern part PA2 formed to pass through the second layer 1200 may be disposed in the first region 1A and the second region 2A of the second layer 1200.

Alternatively, referring to FIG. 10, the first pattern part PA1 may be disposed only in the first region 1A of the second layer 1200, and a pattern part may not be disposed in the second region 2A.

The first layer 1100 and the second layer 1200 may include a metal. In detail, the first layer 1100 and the second layer 1200 may include different types of metals.

For example, the first layer 1100 and the second layer 1200 may include materials having different thermal conductivity. In detail, a thermal conductivity of the first layer 1100 may be greater than that of the second layer 1200. In detail, the first layer 1100 may include a metal having a thermal conductivity of about 20 W/mK or more.

That is, the first layer 1100 may be disposed under the second layer 1200 to serve to dissipate heat flowing into the elastic member 1000 to the outside. That is, the first layer 1100 may serve as a heat dissipation layer in the elastic member 1000.

A thickness T1 of the first layer 1100 may be 100 μm or less. In detail, the thickness T1 of the first layer 1100 may be 30 μm to 100 μm. In more detail, the thickness T1 of the first layer 1100 may be 45 μm to 85 μm.

When the thickness T1 of the first layer 1100 exceeds 100 μm, the overall stress of the elastic member may be increased due to the thickness of the first layer, and thus the folding characteristics of the elastic member may be deteriorated. In addition, when the thickness T1 of the first layer 1100 is less than 30 μm, the first layer may not have sufficient heat conduction effect, and thus the elastic member may be deformed by heat.

The elastic member according to the first embodiment may include a plurality of layers.

In detail, the elastic member according to the first embodiment may include a first layer having high thermal conductivity. Accordingly, the elastic member according to the first embodiment may increase the overall thermal conductivity of the elastic member by the first layer.

Therefore, when the elastic member is applied to the display device, heat transferred from the display panel may be effectively dissipated to the outside.

Accordingly, elasticity and strength of the elastic member may be maintained by preventing the elastic member from being deformed by heat, and thus the folding characteristics of the elastic member may be maintained.

Hereinafter, an elastic member according to a second embodiment will be described with reference to FIGS. 11 to 15. In the description of the elastic member according to the second embodiment, a description of a configuration the same as or similar to that of the elastic member according to the first embodiment described above will be omitted. In addition, in the description of the elastic member according to the second embodiment, the same reference numerals are assigned to configurations the same as or similar to those of the elastic member according to the first embodiment. In addition, the elastic member according to the second embodiment may be implemented independently or may be implemented in combination with the elastic member according to the first embodiment described above.

FIGS. 11 and 12 are views illustrating a top view of the elastic member according to the second embodiment. FIG. 11 is a view illustrating a top view of a first surface of the elastic member according to the second embodiment, and FIG. 12 is a view illustrating a top view of a second surface of the elastic member according to the second embodiment.

Referring to FIGS. 11 and 12, an elastic member 1000 according to the second embodiment may include a plurality of pattern parts. In detail, in the elastic member 1000 according to the second embodiment, a plurality of pattern parts may be formed in a first layer 1100 among layers of the elastic member, unlike the elastic member according to the first embodiment described above.

Referring to FIG. 11, a first surface 1S of the elastic member 1000 according to the second embodiment may be one surface of a second layer 1200 among the layers of the elastic member. Pattern parts may not be disposed on the second layer 1200.

In addition, referring to FIG. 12, a second surface 2S of the elastic member 1000 according to the second embodiment may be one surface of the first layer 1100 among the layers of the elastic member. Pattern parts may be disposed on the first layer 1100.

That is, a plurality of pattern parts may be disposed on the second surface 2S defined as one surface of the first layer 1100 of the elastic member 1000. In detail, a plurality of pattern parts disposed in at least one of the first region 1A and the second region 2A may be disposed on the second surface 2S defined as one surface of the first layer 1100 of the elastic member 1000. For example, a first pattern part PA1 disposed in the first region 1A and a second pattern parts PA2 disposed in the second region 2A may be included on the second surface 2S defined as one surface of the first layer 1100 of the elastic member 1000.

At least one of the first pattern part PA1 and the second pattern part PA2 may be formed by partially or entirely etching the first layer 1100. That is, at least one of the first pattern part PA1 and the second pattern part PA2 may be a hole or a groove formed in the first layer 1100.

Sizes, positions, etc. of the first pattern part PA1 and the second pattern part PA2 are the same as and similar to those described in the description of the first pattern part PA1 and the second pattern part PA2 according to the first embodiment described above, and thus description of them will be omitted below FIGS. 13 to 15 are views illustrating a cross-sectional view of the elastic member according to the second embodiment.

Referring to FIGS. 13 to 15, the elastic member 1000 according to the second embodiment may include the first layer 1100 and the second layer 1200. In detail, the elastic member 1000 may include the first layer 1100 and the second layer 1200 disposed on the first layer 1100.

The first layer 1100 and the second layer 1200 may be disposed in contact with each other. That is, an upper surface of the first layer 1100 and a lower surface of the second layer 1200 may be disposed in direct contact with each other.

The first layer 1100 and the second layer 1200 may be manufactured in a clad method so as to be in direct contact with each other.

Clad bonding is a method of bonding the first layer 1100 and the second layer 1200 by a method such as welding, rolling, casting, or extrusion without bonding using an adhesive, and it is possible to show better bonding force over time by destroying a mutual organization of each layer and stabilizing the bonding of each layer through interstitial penetration.

For example, the bonding may be formed by inducing atomic diffusion between dissimilar materials at a layer interface of different layers through rolling. Since the clad bonding may process curved surfaces unlike bonding using an adhesive and uses atomic diffusion bonding rather than bonding using the adhesive, it has an advantage of being able to maintain a bonded state for a long time.

For example, the first layer 1100 may use a layer with good thermal conductivity to improve heat dissipation characteristics, and the second layer 1200 may use a layer with good yield strength to bond two layers that may be well restored to an unfolded state that is an original state after folding without an adhesive, thereby improving thickness reduction and bonding strength, improving overall folding reliability, and efficiently reducing heat generated from a display.

That is, the first layer 1100 and the second layer 1200 may be in direct contact with each other, and a diffusion part D in which two layers of elements are diffused may be formed at an interface between the first layer 1100 and the second layer 1200.

The first layer 1100 and the second layer 1200 may include a metal. For example, the first layer 1100 and the second layer 1200 may include different types of metals.

A thermal conductivity of the first layer 1100 and a thermal conductivity of the second layer 1200 may be different from each other. In detail, the thermal conductivity of the first layer 1100 may be greater than that of the second layer 1200. Accordingly, the first layer 1100 may have improved heat dissipation characteristics compared to the second layer 1200.

The first layer 1100 may have a thermal conductivity of about 20 W/mK or more. That is, the first layer 1100 may include a metal having the thermal conductivity of 20 W/mK or more. In addition, the second layer 1200 may include a metal having a thermal conductivity of less than 20 W/mK.

In detail, the first layer 1100 may have a thermal conductivity of 30 W/mK to 200 W/mK. In more detail, the first layer 1100 may have a thermal conductivity of 50 W/mK to 160 W/mK. In more detail, the first layer 1100 may have a thermal conductivity of 80 W/mK to 120 W/mK.

When the thermal conductivity of the first layer 1100 is less than 20 W/mK, heat of the elastic member may not be effectively dissipated to the outside. In addition, when the thermal conductivity of the first layer 1100 exceeds 200 W/mK, a thickness of the first layer 1100 may be increased in order to increase the thermal conductivity of the first layer 1100, and the heat dissipation effect may be negligible due to the increase in the thermal conductivity.

In addition, a yield strength of the first layer 1100 and a yield strength of the second layer 1200 may be different from each other. In detail, the yield strength of the second layer 1200 may be greater than that of the first layer 1100. Accordingly, a strain rate of the second layer 1200 may be smaller than that of the first layer 1100.

The yield strength of the second layer 1200 may be about 0.7 GPa or more. That is, the second layer 1200 may include a metal having a yield strength of about 0.7 GPa or more. In addition, the first layer 1100 may include a metal having a yield strength of less than about 0.7 GPa.

In detail, the yield strength of the second layer 1200 may be 0.8 GPa or more. In more detail, the yield strength of the second layer 1200 may be 0.9 GPa or more. In more detail, the yield strength of the second layer 1200 may be 1.0 GPa or more.

When the yield strength of the second layer 1200 is less than 0.7 GPa, when the elastic member is folded, the strength of the elastic member is reduced, and accordingly, plastic deformation may occur in the elastic member in the folding and restoration process.

For example, the first layer 1100 may include copper (Cu) and the second layer 1200 may include SUS, but the embodiment is not limited thereto, and the first layer 1100 and the second layer 1200 may include various materials satisfying the thermal conductivity and the yield strength.

The first layer 1100 and the second layer 1200 may have different thicknesses. In detail, the thickness T1 of the first layer 1100 may be greater than the thickness T2 of the second layer 1200.

For example, the thickness T1 of the first layer 1100 may be 60% to 90% of a total thickness T1+T2 of the elastic member 1000.

As an example, the thickness T1 of the first layer 1100 may be 150 μm or less. In detail, the thickness T1 of the first layer 1100 may be 80 μm to 150 μm.

When the thickness T1 of the first layer 1100 is less than 60% of the total thickness of the elastic member 1000, the overall heat dissipation characteristics of the elastic member 1000 may be deteriorated. In addition, when the thickness T1 of the first layer 1100 exceeds 90% with respect to the total thickness of the elastic member 1000, the overall yield strength of the elastic member is reduced, the plastic deformation may occur in the elastic member in the process of folding or restoring the elastic member.

In addition, the thickness T2 of the second layer 1200 may be 10% to 40% of the total thickness of the elastic member 1000.

As an example, the thickness T2 of the second layer 1200 may be 50 μm or less. In detail, the thickness T2 of the second layer 1200 may be 10 μm to 50 μm.

When the thickness T2 of the second layer 1200 has a thickness of less than 10% of the total thickness of the elastic member 1000, the overall yield strength of the elastic member is reduced, and thus the plastic deformation may occur in the elastic member in the folding and restoration process. In addition, when the thickness T2 of the second layer 1200 exceeds 40% of the total thickness of the elastic member 1000, the overall heat dissipation characteristic of the elastic member 1000 is deteriorated, and accordingly, when the elastic member is applied to the display device, an additional heat dissipation layer may be required, and deformation of the elastic member 1000 by heat may occur.

At least one of the first pattern part PA1 and the second pattern part PA2 including the plurality of holes or grooves described above may be formed in at least one of the first layer 1100 and the second layer 1200. In detail, at least one of the first pattern part PA1 and the second pattern part PA2 may be disposed on the first layer 1100.

That is, the first pattern part PA1 may be disposed on the first layer 1100 corresponding to the first region 1A of the elastic member 1000, and second pattern part PA2 may be disposed on the first layer 1100 corresponding to the second region 2A.

Referring to FIG. 13, the first pattern part PA1 and the second pattern part PA2 may be formed by partially etching the elastic member 1000. In detail, the first pattern part PA1 and the second pattern part PA2 may be opened from the first surface 1S of the elastic member 1000 and may extend in a direction of the second surface 2S. In more detail, the first pattern part PA1 and the second pattern part PA2 may be opened in the first layer 1100 of the elastic member 1000 and may extend in a direction of the second layer 1200.

The first pattern part PA1 and the second pattern part PA2 may be formed by partially etching the first layer 1100. For example, a bottom surface of the first pattern part PA1 and a bottom surface of the second pattern part PA2 may be spaced apart from the interface between the first layer 1100 and the second layer 1200 by a predetermined distance d.

Since the first pattern part PA1 and the second pattern part PA2 are formed on the first layer 1100, the elastic member 1000 may have improved heat dissipation characteristics and folding reliability.

That is, since the first pattern part PA1 and the second pattern part PA2 are formed on the first layer 1100 having a relatively low yield strength compared to the second layer 1200, when the elastic member is folded, the plastic deformation of the elastic member may be minimized by the second layer 1200 having a high yield strength.

In addition, the heat dissipation characteristics of the elastic member 1000 may be improved by the first layer 1100 formed to have a relatively thick thickness compared to the second layer 1200, and the stress of the elastic member may be reduced by the first pattern part and the second pattern part disposed on the first layer 1100, and thus the elastic member may be easily folded.

In addition, when disposing or bonding an additional panel on the elastic member, since the panel is disposed on the second layer on which the pattern part is not formed, an additional planarization layer is not required, and accordingly, the overall thickness of the display device including the elastic member and the panel may be reduced, Meanwhile, referring to FIG. 14, the first pattern part PA1 and the second pattern part PA2 may be formed by entirely etching the first layer 1100. That is, the first pattern part PA1 and the second pattern part PA2 may be formed to pass through the first layer 1100. That is, the first pattern part PA1 and the second pattern part PA2 may be disposed to extend to the interface between the first layer 1100 and the second layer 1200.

Accordingly, an inner surface of the first pattern part PA1 and an inner surface of the second pattern part PA2 and the bottom surface of the first pattern part PA1 and the bottom surface of the second pattern part PA2 may include different materials.

That is, the inner surface of the first pattern part PA1 and the inner surface of the second pattern part PA2 may include the same material as that of the first layer 1100, and the bottom surface of the first pattern part PA1 and the bottom surface of the second pattern part PA2 may include the same material as that of the second layer 1200 exposed by the first pattern part PA1 and the second pattern part PA2.

Alternatively, referring to FIG. 15, the first pattern part PA1 and the second pattern part PA2 may be formed by etching the first layer 1100 and the second layer 1200. In detail, the first pattern part PA1 and the second pattern part PA2 may completely etch the first layer 1100 and partially etch the second layer 1200.

Accordingly, the first pattern part PA1 and the second pattern part PA2 may be formed in a hole shape passing through the first layer 1100 in the first layer 1100 and may be formed in a groove shape partially formed on the second layer 1200 in the second layer 1200.

Therefore, the bottom surface of the first pattern part PA1 and the bottom surface of the second pattern part PA2 may become the second layer 1200 exposed by the first pattern part PA1 and the second pattern part PA2.

Accordingly, the inner surface of the first pattern part PA1 and the inner surface of the second pattern part PA2 may include different materials depending on a depth thereof. In detail, a part of the inner surface of the first pattern part PA1 and the inner surface of the second pattern part PA2 may include the same material as that of the first layer 1100, and other parts of the inner surface of the first pattern part PA1 and the inner surface of the second pattern part PA2 may include the same material as that of the second layer 1200.

In addition, the inner surface of the first pattern part PA1 and the inner surface of the second pattern part PA2 and the bottom surface of the first pattern part PA1 and the bottom surface of the second pattern part PA2 may include the same material or different materials.

That is, a part of the inner surface of the first pattern part PA1 and the inner surface of the second pattern part PA2 may include a material different from that of the bottom surface of the first pattern part PA1 and the second pattern part PA2, and other parts of the inner surface of the first pattern part PA1 and the inner surface of the second pattern part PA2 may include a material the same as that of the bottom surface of the first pattern part PA1 and the bottom surface of the second pattern part PA2.

The elastic member according to the second embodiment may include a plurality of layers.

In detail, the elastic member according to the second embodiment may include a first layer and a second layer having different strength and thermal conductivity characteristics.

In addition, the pattern part of the elastic member may be disposed on the first layer having a relatively large thickness and thermal conductivity.

Accordingly, in the elastic member according to the second embodiment, the heat dissipation characteristics of the elastic member may be improved by the first layer having high thermal conductivity. In addition, the folding characteristics of the elastic member may be improved by reducing the compressive stress of the elastic member by the plurality of pattern parts disposed on the first layer.

In addition, by disposing the pattern part in the first layer and not forming an additional pattern part in the second layer, the strength of the elastic member may be maintained by the second layer having relatively high strength.

In addition, since the first layer and the second layer are in direct contact with each other to adhere in the clad method, the thickness of the elastic member may be reduced, and adhesive properties of the first layer and the second layer may be improved.

Therefore, the elastic member according to the second embodiment may have improved heat dissipation characteristics, strength, folding characteristics, and reliability.

Hereinafter, an elastic member according to a third embodiment will be described with reference to FIGS. 16 and 17. In the description of the elastic member according to the third embodiment, a description of a configuration the same as or similar to that of the elastic member according to the second embodiment described above will be omitted. In addition, in the description of the elastic member according to the third embodiment, the same reference numerals are assigned to configurations the same as or similar to those of the elastic member according to the second embodiment. In addition, the elastic member according to the third embodiment may be implemented independently or may be implemented in combination with the elastic member according to the first and/or second embodiments described above.

Referring to FIGS. 16 and 17, the elastic member 1000 may further include an adhesive layer 100. In detail, the elastic member 1000 may further include the adhesive layer 100 disposed between the first layer 1100 and the second layer 1200.

The adhesive layer may be disposed between the first layer 1100 and the second layer 1200 to adhere the first layer 1100 and the second layer 1200.

A thickness T4 of the adhesive layer 100 may be different from a thickness T1 of the first layer 1100 and a thickness T2 of the second layer. In detail, the thickness T4 of the adhesive layer 100 may be smaller than the thickness T1 of the first layer 1100. In addition, the thickness T4 of the adhesive layer 100 may be the same as or greater than the thickness of the second layer 1200.

The adhesive layer 100 may include a resin material. In detail, the adhesive layer 100 may include a resin material including a metal. For example, the adhesive layer 100 may include a pressure sensitive adhesive (PSA) including metal particles. For example, the adhesive layer 100 may include copper.

As the adhesive layer 100 includes metal particles, the heat dissipation effect of the elastic member may be improved. That is, the elastic member may increase the thermal conductivity of the adhesive layer by the metal particles, thereby realizing the heat dissipation effect through the adhesive layer.

In addition, adhesive strength between the first layer 1100 and the second layer 1200 may be improved by the adhesive layer 100. That is, by disposing the adhesive layer 100 between the first layer 1100 and the second layer 1200 including different metal materials, adhesion between the first layer 1100 and the second layer 1200 may be facilitated.

In addition, by preventing a material of the second layer from moving into the material of the first layer and being alloyed by the adhesive layer when a high-temperature process is performed, it is possible to prevent deterioration of the heat dissipation characteristics of the first layer.

Hereinafter, an elastic member according to a fourth embodiment will be described with reference to FIGS. 18 to 22. In the description of the elastic member according to the fourth embodiment, a description of a configuration the same as or similar to that of the elastic member according to the second and third embodiments described above will be omitted. In addition, in the description of the elastic member according to the fourth embodiment, the same reference numerals are assigned to configurations the same as or similar to those of the elastic member according to the second and third embodiments. In addition, the elastic member according to the fourth embodiment may be implemented independently or may be implemented in combination with the elastic member according to at least one of the first, second, and third embodiments described above.

FIGS. 18 and 19 are views illustrating a top view of the elastic member according to the fourth embodiment. FIG. 18 is a view illustrating a top view of a first surface of the elastic member according to the fourth embodiment, and FIG. 19 is a view illustrating a top view of a second surface of the elastic member according to the fourth embodiment.

Referring to FIGS. 18 and 19, the elastic member 1000 according to the fourth embodiment may include a plurality of pattern parts. In detail, in the elastic member 1000 according to the fourth embodiment, a plurality of pattern parts may be formed in the first layer 1100 and the third layers 1300 among layers of the elastic member, unlike the elastic member according to the second and third embodiments described above.

That is, the elastic member according to the fourth embodiment may include a first layer 1100, a second layer 1200 on the first layer 1100, and a third layer 1300 on the second layer 1200, and the plurality of pattern parts may be disposed on the first layer 1100 and the third layer 1300.

For example, the plurality of pattern parts may be disposed on the second surface 2S defined as one surface of the first layer 1100 of the elastic member 1000. In addition, the plurality of pattern parts may be disposed on the first surface 1S defined as one surface of the third layer 1300 of the elastic member 1000.

In detail, a plurality of pattern parts disposed in at least one of the first region 1A and the second region 2A may be disposed on the second surface 2S defined as one surface of the first layer 1100 of the elastic member 1000. For example, a first pattern part PA1-1 disposed in the first region 1A and a second pattern part PA2-1 disposed in the second region 2A may be included on the second surface 2S defined as one surface of the first layer 1100 of the elastic member 1000.

In addition, a plurality of pattern parts disposed in at least one of the first region 1A and the second region 2A may be disposed on the first surface 1S defined as one surface of the third layer 1300 of the elastic member 1000. For example, a third pattern part PA1-2 disposed in the first region 1A and a fourth pattern parts PA2-2 disposed in the second region 2A may be included on the first surface 1S defined as one surface of the third layer 1300 of the elastic member 1000.

That is, unlike the elastic member according to the second and third embodiments, in the elastic member according to the fourth embodiment, the pattern part may be disposed on both the first surface 1S and the second surface 2S of the elastic member 1000.

The first pattern part PA1-1 and the third pattern part PA1-2 respectively disposed on the first layer 1100 and the third layer 1300 of the first region 1A may be disposed at positions corresponding to each other. In detail, the first pattern part PA1-1 and the third pattern part PA1-2 disposed in the first region 1A may be disposed at a position overlapping in a thickness direction of the elastic member 1000. For example, the first pattern part PA1-1 and the third pattern part PA1-2 disposed in the first region 1A may be disposed at a position that completely overlaps or partially overlaps in the thickness direction of the elastic member 1000.

Alternatively, the first pattern part PA1-1 and the third pattern part PA1-2 respectively disposed on the first layer 1100 and the third layer 1300 of the first region 1A may be disposed at positions that are misaligned from each other. That is, the first pattern part PA1-1 and the third pattern part PA1-2 respectively disposed on the first layer 1100 and the third layer 1300 of the first region 1A may be disposed at a position that does not overlap in the thickness direction of the elastic member 1000.

In addition, the first pattern part PA1-1 and the third pattern part PA1-2 respectively disposed on the first layer 1100 and the third layer 1300 of the first region 1A may be formed of the same size or similar size to each other. In detail, a size of an opening region and/or a size and/or a depth of an inner region of the first pattern part PA1-1 and the third pattern part PA1-2 respectively disposed on the first layer 1100 and the third layer 1300 of the first region 1A may be the same or similar in size.

Accordingly, by minimizing stress non-uniformity between the first layer 1100 and the third layer 1300 of the elastic member 1000, the plastic deformation due to stress when the elastic member 1000 is folded may be minimized.

In addition, the first pattern part PA1-1 and the third pattern part PA1-2 may not communicate with each other. That is, the first pattern part PA1-1 and the third pattern part PA1-2 may be defined as grooves disposed in the elastic member 1000, and the first pattern part PA1-1 and the third pattern parts PA1-2 may not be connected to each other. That is, the first pattern part PA1-1 and the third pattern part PA1-2 may be separated from each other by the second layer 1200 disposed between the first layer 1100 and the third layer 1300.

The second pattern part PA2-1 and the fourth pattern part PA2-2 respectively disposed on the first layer 1100 and the third layer 1300 of the second region 2A may be disposed at positions corresponding to each other. In detail, the second pattern part PA2-1 and the fourth pattern part PA2-2 disposed in the second region 2A may be disposed at a position overlapping in the thickness direction of the elastic member 1000. For example, the second pattern part PA2-1 and the fourth pattern part PA2-2 disposed in the second region 2A may be disposed at a position that completely overlaps or partially overlaps in the thickness direction of the elastic member 1000.

Alternatively, the second pattern part PA2-1 and the fourth pattern part PA2-2 respectively disposed on the first layer 1100 and the third layer 1300 of the second region 2A may be disposed at positions that are misaligned from each other. That is, the second pattern part PA2-1 and the fourth pattern part PA2-2 respectively disposed on the first layer 1100 and the third layer 1300 of the second region 2A may be disposed at a position that does not overlap in the thickness direction of the elastic member 1000.

In addition, the second pattern part PA2-1 and the fourth pattern part PA2-2 respectively disposed on the first layer 1100 and the third layer 1300 of the second region 2A may be formed of the same size or similar size to each other. In detail, a size of an opening region and/or a size and/or a depth of an inner region the second pattern part PA2-1 and the fourth pattern part PA2-2 respectively disposed on the first layer 1100 and the third layer 1300 of the second region 2A may be the same or similar in size.

Accordingly, by minimizing the stress non-uniformity between the first layer 1100 and the third layer 1300 of the elastic member 1000, the plastic deformation due to stress when the elastic member 1000 is folded may be minimized.

In addition, the second pattern part PA2-1 and the fourth pattern part PA2-2 may not communicate with each other. That is, the second pattern part PA2-1 and the fourth pattern part PA2-2 may be defined as grooves disposed in the elastic member 1000, and the second pattern part PA2-1 and the fourth pattern part PA2-2 may not be connected to each other. That is, the second pattern part PA2-1 and the fourth pattern part PA2-2 may be separated from each other by the second layer 1200 disposed between the first layer 1100 and the third layer 1300.

FIGS. 20 to 22 are views illustrating a cross-sectional view of the elastic member according to the fourth embodiment.

Referring to FIGS. 20 to 22, the elastic member 1000 may include the first layer 1100, the second layer 1200, and the third layer 1300. In detail, the elastic member 1000 may include the first layer 1100, the second layer 1200 disposed on the first layer 1100, and the third layer 1300 disposed on the second layer 1200.

The first layer 1100, the second layer 1200, and the third layer 1300 may be adhered to each other. For example, the first layer 1100, the second layer 1200, and the third layer 1300 may be adhered without an additional adhesive by the clad method described above.

That is, the first layer 1100, the second layer 1200, and the third layer 1300 may be in direct contact with each other and may be adhered to each other.

Alternatively, the first layer 1100, the second layer 1200, and the third layer 1300 may be adhered through an adhesive. In detail, an adhesive layer may be disposed between at least one of between the first layer 1100 and the second layer 1200 and between the second layer 1200 and the third layer 1300, and accordingly, the first layer 1100, the second layer 1200, and the third layer 1300 may be adhered to each other.

That is, unlike the above-described embodiment, the elastic member according to the fourth embodiment may further include the third layer disposed on the second layer.

The first layer 1100 and the second layer 1200 may be disposed in contact with each other. That is, an upper surface of the first layer 1100 and a lower surface of the second layer 1200 may be disposed in direct contact with each other.

In addition, the second layer 1200 and the third layer 1300 may be disposed in contact with each other. That is, an upper surface of the second layer 1200 and a lower surface of the third layer 1300 may be disposed in direct contact with each other.

That is, the second layer 1200 may be disposed between the first layer 1100 and the third layer 1300 and may be in direct contact with the first layer 1100 and the third layer 1300.

The first layer 1100, the second layer 1200, and the third layer 1300 may include a metal. For example, the first layer 1100, the second layer 1200, and the third layer 1300 may include different types of metals. In detail, at least one of the first layer 1100, the second layer 1200, and the third layer 1300 may include a different metal from the other layers.

In detail, the first layer 1100 and the third layer 1300 may include the same or similar metal. Alternatively, the first layer 1100 and the third layer 1300 may include a metal having the same or similar chemical/physical properties.

For example, a thermal conductivity of the first layer 1100 and a thermal conductivity of the third layer 1300 may be the same or similar to each other. In addition, the yield strength of the first layer 1100 and the yield strength of the third layer 1300 may be the same or similar to each other.

In addition, the first layer 1100 and the third layer 1300 may include different metals from the second layer 1200. Alternatively, the first layer 1100 and the third layer 1300 may include a metal having different chemical/physical properties from the second layer 1200.

For example, at least one of the thermal conductivity of the first layer 1100 and the thermal conductivity of the third layer 1300 may be greater than the thermal conductivity of the second layer 1200. Accordingly, at least one of the first layer 1100 and the third layer 1300 may have improved heat dissipation characteristics compared to the second layer 1200.

In addition, at least one of yield strength of the first layer 1100 and yield strength of the third layer 1300 may be smaller than yield strength of the second layer 1200. Accordingly, a strain rate of the second layer 1200 may be smaller than that of at least one of the first layer 1100 and the third layer 1300.

That is, ranges of the thermal conductivity and yield strength of the second layer 1200 and the third layer 1300 may be the same as or similar to ranges of the thermal conductivity and yield strength of the first layer 1100 and the second layer 1200 described above.

For example, the first layer 1100 and the third layer 1300 may include copper (Cu), and the second layer 1200 may include SUS.

The first layer 1100, the second layer 1200, and the third layer 1300 may have different thicknesses. In detail, a thickness T1 of the first layer 1100 and a thickness T3 of the third layer 1300 may be greater than a thickness T2 of the second layer 1200.

For example, the thickness T1 of the first layer 1100 may be 30% to 40% of a total thickness T1+T2+T3 of the elastic member 1000.

In addition, the thickness T3 of the third layer 1300 may be 30% to 40% of the total thickness T1+T2+T3 of the elastic member 1000.

As an example, the thickness T1 of the first layer 1100 and the thickness T3 of the third layer 1300 may be 75 μm or less. In detail, the thickness T1 of the first layer 1100 and the thickness T3 of the third layer 1300 may be 40 μm to 75 μm.

When the thickness T1 of the first layer 1100 and the thickness T3 of the third layer 1300 have a thickness of less than 30% of the total thickness of the elastic member 1000, the overall heat dissipation characteristics of the elastic member 1000 may be deteriorated. In addition, when the thickness T1 of the first layer 1100 and the thickness T3 of the third layer 1300 exceed 40% of the total thickness of the elastic member 1000, the overall yield strength of the elastic member is reduced, the plastic deformation may occur in the elastic member in the process of folding or restoring the elastic member.

In addition, the thickness T2 of the second layer 1200 may be 10% to 20% of the total thickness of the elastic member 1000.

As an example, the thickness T2 of the second layer 1200 may be 50 μm or less. In detail, the thickness T2 of the second layer 1200 may be 10 μm to 50 μm.

When the thickness T2 of the second layer 1200 has a thickness of less than 10% of the total thickness of the elastic member 1000, the overall yield strength of the elastic member is reduced, and thus the plastic deformation may occur in the elastic member in the folding and restoration process. In addition, when the thickness T2 of the second layer 1200 exceeds 20% of the total thickness of the elastic member 1000, the overall heat dissipation characteristic of the elastic member 1000 is deteriorated, and accordingly, when the elastic member is applied to the display device, an additional heat dissipation layer may be required, and deformation of the elastic member 1000 by heat may occur.

The above-described pattern part may be formed in at least one of the first layer 1100, the second layer 1200, and the third layer 1300. In detail, the pattern part may be disposed on the first layer 1100 and the third layer 1300.

That is, the first pattern part PA1-1 may be disposed on the first layer 1100 corresponding to the first region 1A of the elastic member 1000, and the third pattern part PA1-2 may be disposed on the third layer 1300 corresponding to the first region 1A of the elastic member 1000.

In addition, the second pattern part PA2-1 may be disposed on the first layer 1100 corresponding to the second region 2A of the elastic member 1000, and the fourth pattern part PA2-2 may be disposed on the third layer 1300 corresponding to the second region 2A of the elastic member 1000.

Referring to FIG. 20, the first pattern part PA1-1, the third pattern part PA1-2, the second pattern part PA2-1, and the fourth pattern part PA2-2 may be formed by partially etching the elastic member 1000. For example, bottom surfaces of the first pattern part PA1-1 and the second pattern part PA2-1 may be formed to be spaced apart from an interface between the first layer and the second layer by a predetermined distance, and bottom surfaces of the third pattern part PA1-2 and the fourth pattern part PA2-2 may be formed to be spaced apart from an interface between the second layer and the third layer by a predetermined distance.

In detail, the first pattern part PA1-1 and the second pattern part PA2-1 may be opened on the first surface 1S of the elastic member 1000 to extend toward the second surface 2S

In addition, the third pattern part PA1-2 and the fourth pattern part PA2-2 may be opened on the second surface 2S of the elastic member 1000 to extend toward the first surface 1S.

In detail, the first pattern part PA1-1 and the second pattern part PA2-1 may be formed by partially etching the first layer 1100. For example, the bottom surfaces of the first pattern part PA1-1 and the second pattern part PA2-1 may be formed to be spaced apart from the interface between the first layer 1100 and the second layer 1200.

In addition, the third pattern part PA1-2 and the fourth pattern part PA2-2 may be formed by partially etching the third layer 1300. For example, the bottom surfaces of the third pattern part PA1-2 and the fourth pattern part PA2-2 may be formed to be spaced apart from the interface between the third layer 1300 and the second layer 1200.

Accordingly, the first pattern part PA1-1 and the third pattern part PA1-2, and the second pattern part PA2-1 and the fourth pattern part PA2-2 do not communicate with each other and may be disposed on the first layer 1100 and the third layer 1300, respectively.

Since the pattern parts are formed on the first layer 1100 and the third layer 1300, the elastic member 1000 may have improved heat dissipation characteristics and folding reliability.

That is, since the pattern parts are formed in the first layer 1100 and the third layer 1300 having a low yield strength, when the elastic member is folded, the plastic deformation of the elastic member may be minimized by the second layer 1200 having a high yield strength.

In addition, the heat dissipation characteristics of the elastic member 1000 may be improved by the second layer 1200 formed to have a relatively thick thickness compared to the first layer 1100 and the third layer 1300, and the stress of the elastic member may be reduced by the pattern parts disposed on the first layer 1100 and the third layer 1300, and thus the elastic member may be easily folded.

In addition, since the pattern part is formed on both the first surface 1S and the second surface 2S of the elastic member 1000, a stress difference between the first surface 1S and the second surface 2S may be minimized, and accordingly, it is possible to have similar folding reliability when bending in a direction facing the first surface or bending the elastic member in a direction facing the second surface, thereby improving the degree of folding freedom.

Meanwhile, referring to FIG. 21, the first pattern part PA1-1, the third pattern part PA1-2, the second pattern part PA2-1, and the fourth pattern part PA2-2 may be formed by entirely etching the first layer 1100 and the third layer 1300. That is, the first pattern part PA1-1 and the second pattern part PA2-1 may be formed to pass through the first layer 1100, and the third pattern part PA1-2 and the fourth pattern part PA2-2 may be formed to pass through the third layer 1300.

That is, the first pattern part PA1-1 and the second pattern part PA2-1 may be disposed to extend to the interface between the first layer 1100 and the second layer 1200, and the third pattern part PA1-2 and the fourth pattern part PA2-2 may be disposed to extend to the interface between the third layer 1300 and the second layer 1200.

Accordingly, inner surfaces of the first pattern part PA1-1 and the second pattern part PA2-1 and bottom surfaces of the first pattern part PA1-1 and the second pattern part PA2-1 may include different materials.

That is, the inner surfaces of the first pattern part PA1-1 and the second pattern part PA2-1 may include the same material as that of the first layer 1100, and the bottom surfaces of the first pattern part PA1-1 and the second pattern part PA2-1 may include the same material as that of the second layer 1200.

In addition, inner surfaces of the third pattern part PA1-2 and the fourth pattern part PA2-2 and bottom surfaces of the third pattern part PA1-2 and the fourth pattern part PA2-2 may include different materials.

That is, the inner surfaces of the third pattern part PA1-2 and the fourth pattern part PA2-2 may include the same material as that of the third layer 1300, and the bottom surfaces of the third pattern part PA1-2 and the fourth pattern part PA2-2 may include the same material as that of the second layer 1200.

Alternatively, referring to FIG. 22, the first pattern part PA1-1, the third pattern part PA1-2, the second pattern part PA2-1, and the fourth pattern part PA2-2 may be formed by etching the first layer 1100, the second layer 1200, and the third layer 1300. In detail, the first pattern part PA1-1, the third pattern part PA1-2, the second pattern part PA2-1, and the fourth pattern part PA2-2 may completely etch the first layer 1100 and the third layer 1300 and may partially etch the second layer 1200.

Accordingly, the first pattern part PA1-1 and the second pattern part PA2-1 may be formed in a hole shape passing through the first layer 1100 in the first layer 1100 and may be formed in a groove shape partially formed on the second layer 1200 in the second layer 1200.

Therefore, the bottom surfaces of the first pattern part PA1-1 and the second pattern part PA2-1 may become the second layer 1200.

Accordingly, the inner surfaces of the first pattern part PA1-1 and the second pattern part PA2-1 may include different materials depending on a depth thereof. In detail, a part of the inner surfaces of the first pattern part PA1-1 and the second pattern part PA2-1 may include the same material as that of the first layer 1100, and other parts of the inner surfaces of the first pattern part PA1-1 and the second pattern part PA2-1 may include the same material as that of the second layer 1200.

In addition, the inner surfaces of the first pattern part PA1-1 and the second pattern part PA2-1 and the bottoms of the first pattern part PA1-1 and the second pattern part PA2-1 may include the same or different materials.

That is, a part of the inner surfaces of the first pattern part PA1-1 and the second pattern part PA2-1 may include a material different from that of the bottom surfaces of the first pattern part PA1-1 and the second pattern part PA2-1, and the other parts of the first pattern part PA1 and the second pattern part PA2 may include a material the same as that of the bottom surface of the first pattern part PA1 and the bottom surface of the second pattern part PA2.

In addition, the third pattern part PA1-2 and the fourth pattern part PA2-2 may be formed in a hole shape passing through the third layer 1300 in the third layer 1300 and may be formed in a groove shape partially formed on the second layer 1200 in the second layer 1200.

Therefore, the bottom surfaces of the third pattern part PA1-2 and the fourth pattern part PA2-2 may become the second layer 1200.

Accordingly, the inner surfaces of the third pattern part PA1-2 and the fourth pattern part PA2-2 may include different materials depending on a depth thereof. In detail, a part of the inner surfaces of the third pattern part PA1-2 and the fourth pattern part PA2-2 may include the same material as that of the third layer 1300, and other parts of the inner surfaces of the third pattern part PA1-2 and the fourth pattern part PA2-2 may include a material the same as that of the bottom surfaces of the third pattern part PA1-2 and the fourth pattern part PA2-2.

In addition, the inner surfaces of the third pattern part PA1-2 and the fourth pattern part PA2-2 and the bottoms of the third pattern part PA1-2 and the fourth pattern part PA2-2 may include the same or different materials.

That is, a part of the inner surfaces of the third pattern part PA1-2 and the fourth pattern part PA2-2 may include a material different from that of the bottom surfaces of the third pattern part PA1-2 and the fourth pattern part PA2-2, and the other parts of the inner surfaces of the third pattern part PA1-2 and the fourth pattern part PA2-2 may include a material the same as that of the bottom surfaces of the third pattern part PA1-2 and the fourth pattern part PA2-2.

The elastic member according to the fourth embodiment may have improved folding reliability and heat dissipation characteristics.

In detail, the heat dissipation characteristics of the elastic member may be improved by forming thicknesses of the first layer and the third layer having high thermal conductivity to be greater than that of the second layer. In addition, by forming the pattern part in the first layer and the third layer to form an opening, it is possible to reduce the compressive stress applied when the elastic member is folded, thereby easily folding the elastic member.

In addition, since an additional pattern part is not formed in the second layer having high yield strength, a strength of the second layer can be maintained, and thus it is possible to minimize plastic deformation of the elastic member that occurs during folding or restoring due to the second layer having a high deformation rate when the elastic member is folded.

Therefore, the elastic member according to the fourth embodiment may have improved folding reliability and improved heat dissipation characteristics, and thus an additional heat dissipation layer is not required, thereby reducing the thickness of the elastic member or a thickness of the display device to which the elastic member is applied.

Hereinafter, a display device to which an elastic member according to an embodiment is applied will be described with reference to FIGS. 23 to 27.

Referring to FIGS. 23 to 27, a panel 2000 may be disposed on the elastic member 1000. The elastic member 1000 and the panel 2000 may be adhered through the adhesive layers 100, 110, and 120 disposed between the elastic member 1000 and the panel 2000.

In detail, the panel 2000 may be disposed on the second layer 1200 or the third layer 1300 of the elastic member 1000.

The panel 2000 may include at least one of a display panel and a touch panel.

The display panel may include a plurality of pixels including a switching thin film transistor, a driving thin film transistor, a power storage element, and an organic light emitting diode (OLED). In case of the OLED, deposition is possible at a relatively low temperature and may be mainly applied to the flexible display device for reasons of low power and high luminance. Here, the pixel refers to a minimum unit for displaying an image, and the display panel displays an image through the plurality of pixels.

The display panel may include a substrate, a gate line disposed on the substrate, a data line isolated from the gate line, and a common power line. In general, one pixel may be defined by the gate line, the data line, and the common power line as a boundary.

The substrate may include a material having flexible properties such as a plastic film, and the display panel may be implemented by disposing an organic light emitting diode and a pixel circuit on the flexible film.

The touch panel may be disposed on the display panel. The touch panel may implement a touch function in the foldable display device or the flexible display device, and the touch panel may be omitted in a foldable display device or a flexible display device that simply displays an image without the touch function.

The touch panel may include a substrate and a touch electrode disposed on the substrate. The touch electrode may sense a position of an input device touched by the foldable display device or the flexible display device by a capacitive type or a resistive type.

The substrate of the touch panel may include a material having flexible properties such as a plastic film, and the touch panel may be implemented by disposing the touch electrode on the flexible film.

Referring to FIGS. 23 to 27, the display device may further include a protective layer 3000. In detail, the display device may further include the protective layer 3000 disposed under the elastic member 1000.

The protective layer 3000 may be disposed under the elastic member 1000 to serve to absorb an impact applied to the elastic member 1000.

The protective layer 3000 may have a color. For example, the protective layer 3000 may be formed in a black-based color.

The protective layer 3000 may include metal particles. For example, the protective layer 3000 may include copper particles. Accordingly, heat generated in the display device may be dissipated through the protective layer 3000 by improving a thermal conductivity of the protective layer 3000.

The protective layer 3000 may be disposed on one region of the elastic member 1000. In detail, the protective layer 3000 may be disposed in a region corresponding to the first region 1A of the elastic member 1000. Alternatively, the protective layer 3000 may be disposed in a region corresponding to the first region 1A and the second region 2A of the elastic member 1000.

For example, the protective layer 3000 may be disposed in a region corresponding to the first region 1A and the second region 2A of the elastic member 1000 and may be disposed in an area smaller than the sum of areas of the first region 1A and the second region 2A. In detail, the protective layer 3000 may be disposed in an area of 80% to 90% of the sum of the areas of the first region 1A and the second region 2A of the elastic member.

In addition, a thickness of the protective layer 3000 may be smaller than that of the elastic member 1000. That is, the thickness of the protective layer 3000 may be smaller than the sum of thicknesses of the first layer and the second layer of the elastic member 1000 or the sum of thicknesses of the first layer, the second layer, and the third layer.

Meanwhile, referring to FIGS. 23 and 27, the display device may further include a planarization layer 4000.

In detail, when the pattern part of the elastic member 1000 has a hole shape, or the elastic member 1000 includes the first layer, the second layer, and the third layer and the pattern part is formed on the first layer and the third layer, the planarization layer 4000 may be disposed on the elastic member in order to planarize an adhesive surface of the third layer that is adhered to the panel.

That is, a first adhesive layer 110 is disposed between the elastic member 1000 and the planarization layer 4000 so that the elastic member 1000 and the planarization layer 4000 are adhered, and a second adhesive layer 120 may be disposed between the planarization layer 4000 and the panel 2000 so that the planarization layer 4000 and the panel 2000 are adhered.

Accordingly, when an adhesive layer is disposed between the elastic member 1000 and the display panel 2000, it is possible to prevent a thickness of the adhesive layer from being different for each region due to the pattern parts. Therefore, it is possible to improve the reliability of the display device by preventing a decrease in adhesion between the elastic member 1000 and the display panel 2000 due to the non-uniform thickness of the adhesive layer.

Referring to FIGS. 23 to 27, the display device may be bent. That is, the display device may be bent or folded in one direction. For example, the display device may be bent in an arrow direction. That is, the display device may be bent or folded in a direction in which upper surfaces of the panel face each other.

However, the embodiment is not limited thereto, and the display device may be bent in an opposite direction. That is, the display device may be bent or folded in a direction in which lower surfaces of the protective layer face each other.

FIG. 28 is a view for describing an example in which the elastic member according to the embodiments is applied.

Referring to FIG. 28, the elastic member according to the embodiments may be applied to a flexible or foldable display device for displaying a display.

For example, the elastic member according to the embodiments may be applied to a flexible display device such as a mobile phone or a tablet.

Such an elastic member may be applied to a flexible display device such as a mobile phone or a tablet that is flexible, bent, or folded.

The elastic member is applied to the flexible display device such as the mobile phone or the tablet that is flexible, bent or folded and improves the folding reliability in a display device that is repeatedly folded or folded, thereby improving the reliability of the flexible display device.

The characteristics, structures and effects described in the embodiments above are included in at least one embodiment but are not limited to one embodiment. Furthermore, the characteristic, structure, and effect illustrated in each embodiment may be combined or modified for other embodiments by a person skilled in the art. Thus, it should be construed that contents related to such a combination and such a modification are included in the scope of the present invention.

In addition, embodiments are mostly described above, but the embodiments are merely examples and do not limit the present invention, and a person skilled in the art may appreciate that several variations and applications not presented above may be made without departing from the essential characteristic of embodiments. For example, each component specifically shown in the embodiments may be modified and implemented. In addition, it should be construed that differences related to such a variation and such an application are included in the scope of the present invention defined in the following claims.

The invention claimed is:

1. An elastic member including a first region and a second region, the elastic member comprising:
   a first layer, a second layer on the first layer, and a third layer disposed on the second layer,
   wherein the first region is defined as a folding region, the second region is defined as an unfolding region,
   a pattern part including a plurality of holes or grooves is disposed in at least one of the first region and the second region of each of the first layer and the third layer,
   the first layer and the second layer include a metal,
   a thermal conductivity of the first layer is greater than a thermal conductivity of the second layer, and
   a yield strength of the second layer is greater than a yield strength of the first layer,
   the yield strength of the second layer is greater than a yield strength of the third layer, and
   a thermal conductivity of the third layer is greater than the thermal conductivity of the second layer.

2. The elastic member of claim 1, wherein the thermal conductivity of the first layer is 20 W/mK or more, and the yield strength of the second layer is 0.7 GPa or more.

3. The elastic member of claim 1, wherein a thickness of the first layer is greater than a thickness of the second layer.

4. The elastic member of claim 1, wherein the first layer and the second layer are in direct contact with each other.

5. An elastic member including a first region and a second region, the elastic member comprising:
   a first layer; and a second layer on the first layer,
   wherein the first region is defined as a folding region, the second region is defined as an unfolding region,
   a pattern part including a plurality of holes or grooves is disposed in at least one of the first region and the second region of the first layer,
   the first layer and the second layer include a metal,
   a thermal conductivity of the first layer is greater than a thermal conductivity of the second layer,
   a yield strength of the second layer is greater than a yield strength of the first layer,
   the first layer and the second layer are in direct contact with each other,
   wherein a diffusion part is disposed at an interface between the first layer and the second layer, and
   the diffusion part includes a material of the first layer and a material of the second layer.

6. The elastic member of claim 1, wherein an adhesive layer is disposed between the first layer and the second layer.

7. The elastic member of claim 6, wherein a thickness of the adhesive layer is smaller than a thickness of the first layer and greater than or equal to a thickness of the second layer.

8. An elastic member including a first region and a second region, the elastic member comprising:
   a first layer: a second layer on the first layer; and an adhesive layer disposed between the first layer and the second layer,
   wherein the first region is defined as a folding region, the second region is defined as an unfolding region,
   a pattern part including a plurality of holes or grooves is disposed in at least one of the first region and the second region of the first layer,
   the first layer and the second layer include a metal,
   a thermal conductivity of the first layer is greater than a thermal conductivity of the second layer,
   a yield strength of the second layer is greater than a yield strength of the first layer, and
   the adhesive layer includes metal particles.

9. The elastic member of claim 1, wherein the pattern part has a hole or a groove shape.

10. The elastic member of claim 1, further comprising at least one of a first protrusion and a second protrusion that are disposed at an edge of the second region.

11. The elastic member of claim 1, wherein a thickness of the first layer is 80 μm to 150 μm, and
    a thickness of the second layer is 10 μm to 50 μm.

12. The elastic member of claim 1, wherein a thickness of the second layer is 10% to 40% of a total thickness of the elastic member.

13. The elastic member of claim 1, wherein the pattern part is formed by partially etching the second layer.

14. The elastic member of claim 5, further comprising a third layer disposed on the second layer,
    a pattern part including a plurality of holes or grooves is disposed in at least one of the first region and the second region of the third layer,
    the yield strength of the second layer is greater than a yield strength of the third layer, and
    a thermal conductivity of the third layer is greater than the thermal conductivity of the second layer.

15. The elastic member of claim 1, wherein the second layer and the third layer are in direct contact with each other.

16. The elastic member of claim 14, wherein a thickness of the third layer is greater than a thickness of the second layer.

17. A display device comprising:
    the elastic member of claim 1; and
    a panel disposed on the elastic member and including at least one of a display panel and a touch panel.

18. The display device of claim 17, further comprising a protective layer disposed under the elastic member,
    wherein an area of the protective layer is smaller than a sum of areas of the first region and the second region of the elastic member, and
    a thickness of the protective layer is smaller than that a thickness of the elastic member.

19. The display device of claim 17, further comprising a planarization layer disposed between the elastic member and the panel.

20. The display device of claim 18, wherein the protective layer includes copper particles, and
    the protective layer is disposed in a size of 80% to 90% of an area of the elastic member.

* * * * *